(12) United States Patent
Jeon et al.

(10) Patent No.: US 8,816,417 B2
(45) Date of Patent: Aug. 26, 2014

(54) SEMICONDUCTOR DEVICES AND METHODS OF FORMING SEMICONDUCTOR DEVICES

(75) Inventors: Sanghun Jeon, Yongin-si (KR); Jong-Hyuk Kang, Suwon-si (KR); Heungkyu Park, Gumi-si (KR); Jongwook Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1009 days.

(21) Appl. No.: 12/659,111

(22) Filed: Feb. 25, 2010

(65) Prior Publication Data

US 2010/0213521 A1 Aug. 26, 2010

(30) Foreign Application Priority Data

Feb. 26, 2009 (KR) .................. 10-2009-0016409

(51) Int. Cl.
*H01L 27/108* (2006.01)
*H01L 29/94* (2006.01)

(52) U.S. Cl.
USPC .................................. 257/296; 257/E27.016

(58) Field of Classification Search
USPC ........... 257/E27.085, E29.262, E29.008, 901, 257/296, E27.016
See application file for complete search history.

(56) References Cited

U.S. PATENT DOCUMENTS

| | | | |
|---|---|---|---|
| 6,472,258 B1 | 10/2002 | Adkisson et al. | |
| 6,849,552 B2 * | 2/2005 | Park | 438/694 |
| 7,085,153 B2 | 8/2006 | Ferrant et al. | |
| 7,184,298 B2 | 2/2007 | Fazan et al. | |
| 7,187,581 B2 | 3/2007 | Ferrant et al. | |
| 7,301,803 B2 | 11/2007 | Okhonin et al. | |
| 7,592,643 B2 * | 9/2009 | Sun | 257/135 |
| 7,838,928 B2 * | 11/2010 | Graf et al. | 257/330 |
| 2004/0113207 A1* | 6/2004 | Hsu et al. | 257/368 |
| 2005/0224861 A1* | 10/2005 | Lee et al. | 257/315 |
| 2006/0033827 A1* | 2/2006 | Kanbe et al. | 348/302 |
| 2006/0046391 A1* | 3/2006 | Tang et al. | 438/268 |
| 2006/0102967 A1* | 5/2006 | Kamigaki et al. | 257/390 |
| 2007/0007601 A1* | 1/2007 | Hsu et al. | 257/368 |
| 2007/0058427 A1 | 3/2007 | Okhonin et al. | |
| 2008/0237695 A1* | 10/2008 | Shino et al. | 257/324 |
| 2009/0026541 A1* | 1/2009 | Chung | 257/347 |
| 2009/0168574 A1* | 7/2009 | Kang et al. | 365/203 |
| 2009/0200612 A1* | 8/2009 | Koldiaev | 257/368 |
| 2009/0261448 A1* | 10/2009 | Mishra et al. | 257/506 |
| 2010/0038709 A1* | 2/2010 | Wang et al. | 257/329 |

FOREIGN PATENT DOCUMENTS

| | | | | |
|---|---|---|---|---|
| JP | 2002-026299 A | 1/2002 | | |
| KR | 10-1998-0017435 A | 6/1998 | | |
| KR | 10-2002-0037297 A | 5/2002 | | |
| WO | WO 2009112894 A1 * | 9/2009 | | H01L 29/78 |

OTHER PUBLICATIONS

Bawedin, M., et al., "Innovating SOI memory devices based on floating-body effects", Solid-Stte Electronics, 51:1252-1262 (2007).
Günhan Ertosun, M., et al., "A Nanoscale Vertical Double-Gate Single-Transistor Capacitorless DRAM", IEEE Electron Device Letters, 29(6):615-617, (Jun. 2008).
Krusin-Elbaum, L., et al., "Shifts in the flatband voltage of metal-oxide-silicon structure due to iodine in $SiO_2$", Appl. Phys Lett, 48(2):177-179, (1986).
Noguchi, M., et al., "Back Gate Effects on Threshold Voltage Sensitivity to SOI Thickness in Fully-Depleted SOI MOSFETs", IEEE Electron Device Letters, 22(1):32-34 (2001).

* cited by examiner

*Primary Examiner* — Daniel Luke
*Assistant Examiner* — Latanya N Crawford
(74) *Attorney, Agent, or Firm* — Lee & Morse, P.C.

(57) ABSTRACT

A semiconductor device includes a back bias dielectric including a negative fixed charge, a gate electrode overlapping the back bias dielectric, a semiconductor layer disposed between the gate electrode and the back bias dielectric, and a gate dielectric disposed between the semiconductor layer and the gate electrode, wherein the negative fixed charge accumulates holes at a surface of the semiconductor layer facing the back bias dielectric.

19 Claims, 30 Drawing Sheets

1st Direction
3rd Direction ⊙ → 2nd Direction

SEMICONDUCTOR DEVICES AND METHODS OF FORMING SEMICONDUCTOR DEVICES

BACKGROUND

1. Field

Embodiments relate to semiconductor devices, and more particularly, to 1-T DRAMs (dynamic random access memories) and methods of forming such semiconductor devices.

2. Description of the Related Art

As semiconductor devices become more highly integrated, electrical characteristics such as an off-current ($I_{off}$), a subthreshold slope, etc. of transistors may be degraded. As a result, a single gate transistor, a double gate transistor including a FinFET, a transistor having a gate all around structure, etc., have been developed. Also, in order to improve the density of a DRAM having a typical 1-T-1C (1 transistor-1 capacitor), research on a 1-T DRAM having one transistor is being conducted.

SUMMARY

Embodiments are therefore directed to semiconductor devices and methods of forming semiconductor devices, which substantially overcome one or more of the problems due to the limitations and disadvantages of the related art.

It is therefore a feature of an embodiment to provide a semiconductor device including a back bias dielectric including a negative fixed charge.

It is therefore another feature of an embodiment to provide a method of forming semiconductor devices including a back bias dielectric including a negative fixed charge.

At least one of the above and other features and advantages may be realized by providing a semiconductor device, including a back bias dielectric including a negative fixed charge, a gate electrode overlapping the back bias dielectric, a semiconductor layer disposed between the gate electrode and the back bias dielectric, and a gate dielectric disposed between the semiconductor layer and the gate electrode, wherein the negative fixed charge accumulates holes at a surface of the semiconductor layer facing the back bias dielectric.

The semiconductor device may be a 1-T DRAM.

The semiconductor device may include a dielectric disposed between the semiconductor layer and the back bias dielectric.

The negative fixed charge may be formed by a halogen group negative ion.

The back bias dielectric may include at least one of a silicon oxide layer, an aluminum oxide layer, a titanium oxide layer, a tantalum oxide layer, a zirconium oxide layer, a hafnium oxide layer, a hafnium silicon oxide layer and/or a zirconium silicon oxide layer.

The semiconductor layer may be arranged on a semiconductor substrate and the semiconductor layer may extend along a direction crossing a plane along which the semiconductor substrate extends.

The back bias dielectric may be wider at an upper portion thereof than at a lower portion thereof.

The back bias dielectric may include a pair of semiconductor structures, and the back bias dielectric may be arranged between the pair of the semiconductor structures.

The gate electrode may extend between an upper dielectric pattern and a lower dielectric pattern.

The device may include a bit line extending along a first direction, wherein the gate electrode may be arranged on the bit line and extends in a direction crossing the first direction.

At least one of the above and other features and advantages may be separately realized by providing a semiconductor device, including a semiconductor substrate, a device isolation layer extending in a first direction on the semiconductor substrate and at least partially defining a bit line, a pair of semiconductor structures electrically contacting the bit line and disposed on the bit line, the semiconductor structures extending in a second direction crossing the first direction, a back bias dielectric disposed on a first side of each of the semiconductor structures, gate electrodes disposed on a second side of each of the semiconductor structures, the gate electrodes extending in the second direction crossing the first direction, and a gate dielectric disposed between each of the corresponding ones of the gate electrodes and the semiconductor structures, wherein the back bias dielectric is disposed between the first sides of the semiconductor structures facing each other, the back bias dielectric includes a negative fixed charge, and the negative fixed charge accumulates holes at surfaces of the first sides of the semiconductor structures.

The back bias dielectric may extend in the second direction.

The semiconductor device may include source contact plugs electrically connected with the semiconductor structures, and a source line electrically connected with the source contact plugs and extending in the second direction.

The semiconductor device may include a buried dielectric disposed between the semiconductor structure and the back bias dielectric.

At least one of the above and other features and advantages may be separately realized by providing semiconductor a method of forming a semiconductor device, including forming a pair of semiconductor structures on a semiconductor substrate, forming a gate electrode on the semiconductor substrate, forming a back bias dielectric including a negative fixed charge on the semiconductor substrate, forming a gate dielectric on the semiconductor substrate, the gate dielectric being disposed between the semiconductor layer and the gate electrode, wherein the semiconductor substrate extends along a plane extending along a first and a second direction and each of the semiconductor structure, the gate electrode and the back bias dielectric extend along a direction crossing the plane along which the semiconductor substrate extends, the semiconductor layer is arranged between the gate electrode and the back bias dielectric, and the negative fixed charge accumulates holes at a surface of the semiconductor layer facing the back bias dielectric.

The method may include forming a bit line on the semiconductor substrate, wherein the bit line extends below the semiconductor layer, the gate electrode and the back bias dielectric.

The method may include forming a buried dielectric on the semiconductor structures before forming the back bias dielectric.

The method may include forming a lower dielectric pattern on the semiconductor substrate before forming the gate electrode.

The method may include forming an upper dielectric pattern on the semiconductor substrate before forming the gate electrode.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
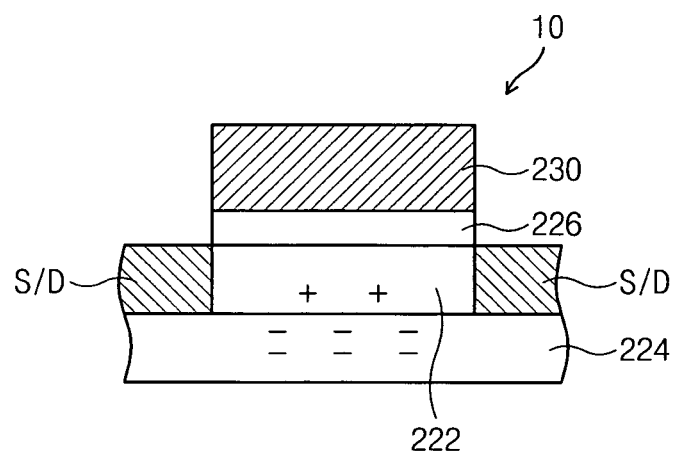
FIG. 1A illustrates a partial cross-sectional view of an exemplary embodiment of a semiconductor device.

Korean Patent Application No. 10-2009-0016409, filed on Feb. 26, 2009, in the Korean Intellectual Property Office, and entitled: "Semiconductor Device," is incorporated by reference herein in its entirety.

Exemplary embodiments will be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element, e.g., layer, film, is referred to as being "on" or "above" another element, it can be directly on or above the other element, or intervening elements may also be present. It will also be understood that when an element is referred to as being "below" or "under" another element, it can be directly below or under the other element, or intervening elements may also be present. In addition, it will also be understood that when an element is referred to as being "between" two elements, it can be the only element between the two elements, or one or more intervening elements may also be present. As used herein, the term "and/or" includes any and all combinations of one or more of the associated listed items. Further, as used herein, the singular forms "a," "an" and "the" are intended to include the plural forms as well, unless the context clearly indicates otherwise. Like reference numerals refer to like elements throughout the specification.

A typical 1-T DRAM may have a silicon on insulator (SOI) structure. The 1-T DRAM may have a "1" state and a "0" state based on a threshold voltage difference ΔVth due to a floating body effect. The 1-T DRAM having the SOI structure may read a variation in threshold voltage Vth according to a body potential.

In the 1-T DRAM having the SOI structure, a hole may be generated as a result of impact ionization, a gate induced drain leakage (GIDL), or an avalanche breakdown. The hole may be accumulated in a silicon (Si) body, which is a relatively stable quasi neutral region. The threshold voltage Vth may be decreased by a potential due to the accumulated charge, so that the logic "1" state may be represented. The accumulated hole may be ejected through the source or drain. Accordingly, when the hole does not remain in the silicon body, the threshold voltage Vth is increased, and the logic "0" state may be represented.

In the 1-T DRAM having the SOI structure, a difference ΔVth in the threshold voltage may be expressed as Equation 1.

$$\Delta V_{th} = \frac{C_{dep}}{C_{ox}} \Delta V_B \qquad \text{(Equation 1)}$$

In Equation 1, $C_{dep}$ indicates a capacitance of a depletion region, $C_{ox}$ indicates a capacitance due to a gate dielectric, and $\Delta V_B$ indicates a difference in a back bias voltage.

To increase the difference ΔVth in the threshold voltage, the capacitance $C_{dep}$ of the depletion region should be increased. In a partially depleted SOI transistor, an increase in a channel doping concentration, e.g., Na, may decrease a depletion width, and the capacitance $C_{dep}$ of the depletion region may increase to increase the difference $\Delta V_{th}$ in the threshold voltage. However, due to a junction leakage current, retention characteristics of holes may be deteriorated.

In the case of a fully depleted SOI transistor, the difference $\Delta V_{th}$ in the threshold voltage may be increased by decreasing a thickness Tsi of a channel semiconductor layer. However, the foregoing method of decreasing the thickness Tsi of the channel semiconductor layer may depend on a back bias. That is, because in the fully depleted SOI transistor, the channel semiconductor layer is fully depleted, there may be no region for a generated hole to be stably positioned.

Alternatively, a method of accumulating holes in a channel below a gate oxide layer may include applying a negative voltage to a gate. However, this method is a limited operating method. Although such a method of applying a negative voltage may be employed, retention characteristics of such a 1-T DRAM may be lower than that of a 1-T-1-C DRAM.

In the fully depleted SOI transistor, the difference $\Delta V_{th}$ in the threshold voltage may depend on the thickness Tsi of the channel semiconductor layer. Accordingly, a random distribution of the difference $V_{th}$ in the threshold voltage according to a random distribution of the thickness Tsi of the channel semiconductor layer may be problematic. It may be possible to decrease the random distribution of the difference $V_{th}$ in the threshold voltage according to the random distribution of the thickness Tsi of the channel semiconductor layer by applying a back bias.

Embodiments of semiconductor devices employing one or more features described below may generate a same effect as an effect as when a back bias voltage is applied by employing a negative fixed charge. Embodiments of semiconductor devices employing one or more features described below may generate a same effect as when a back bias voltage is applied without using a back bias electrode.

Figure 1B:
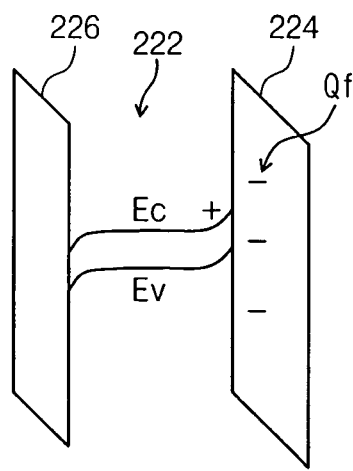
FIG. 1B illustrates an exemplary energy band diagram of the exemplary semiconductor device of FIG. 1A.

FIG. 1A illustrates a partial cross-sectional view of an exemplary embodiment of a semiconductor device 10. FIG. 1B illustrates an exemplary energy band diagram of the exemplary semiconductor device 10 of FIG. 1A.

Referring to FIGS. 1A and 1B, the semiconductor device 10 may include a semiconductor layer 222, a back bias dielectric 224, a gate dielectric 226, a gate electrode 230, and source/drain regions S/D. The back bias dielectric 224 may include a negative fixed charge. The negative fixed charge may accumulate holes at, e.g., a surface of the semiconductor layer 222 facing the back bias dielectric 224. The gate electrode 230 may be disposed above the back bias dielectric 224. The semiconductor layer 222 may be disposed between the gate electrode 230 and the back bias dielectric 224. The gate dielectric 226 may be disposed between the semiconductor layer 222 and the gate electrode 230.

More particularly, the back bias dielectric 224 may include a negative fixed charge Qf. The negative fixed charge Qf in the back bias dielectric 224 may be formed as a result of processing conditions while forming the back bias dielectric 224. As shown in FIG. 1B, when the back bias dielectric 224 has a negative fixed charge Qf, an electron energy band of the semiconductor layer 222 may bend upward at an interface between the semiconductor layer 222 and the back bias dielectric 224. Accordingly, holes may accumulate at the interface between the semiconductor layer 222 and the back bias dielectric 224. The negative fixed charges Qf may be uniformly spatially distributed in the back bias dielectric 224. Alternatively, the negative fixed charges Qf may be distributed only at a surface of the back bias dielectric 224.

The back bias dielectric 224 may include, e.g., a silicon oxide layer, an aluminum oxide layer, a titanium oxide layer, a tantalum oxide layer, a zirconium oxide layer, a hafnium oxide layer, a hafnium silicon oxide layer and/or a zirconium silicon oxide layer.

The negative fixed charge Qf of the back bias dielectric 224 may be formed by an ion implantation process. The ions may include, e.g., a halogen group (VIIA) element. For example, the halogen group (VIIA) element may include, e.g., iodine (I), fluorine (F), chlorine (Cl), and/or bromine (Br). More particularly, e.g., the back bias dielectric 224 may include a silicon oxide layer and the negative fixed charge Qf may be formed by implanting iodine (I) or fluorine (F) ions.

The gate electrode 230 may include a conductive material. For example, the gate electrode 230 may include a doped polysilicon, a metal and/or a metal compound.

The semiconductor layer 222 may include a silicon layer doped with a first conductive type dopant. The first conductive type may be a P-type. The source and drain region S/D doped with a second conductive type dopant may be disposed in the semiconductor layer 222 at both sides of the gate electrode 230. The second conductive type may be an N-type. The first conductive type may be different from the second conductive type.

The gate dielectric 226 may include, e.g., a silicon oxide layer, a silicon oxynitride layer, etc. The gate dielectric 226 may not include a fixed charge.

Figure 2A:
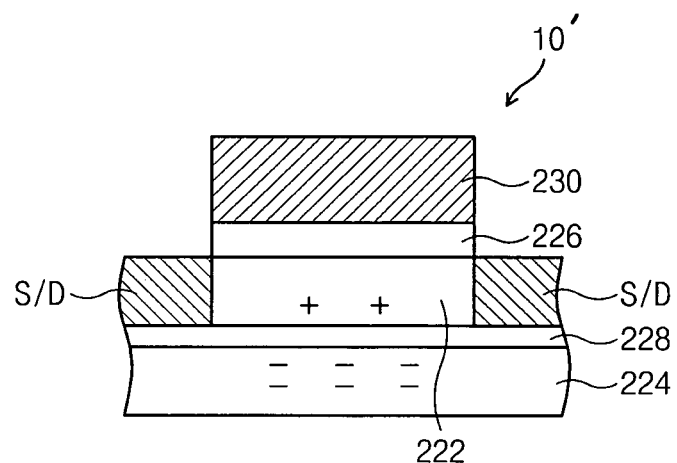
FIG. 2A illustrates a partial cross-sectional view of another exemplary embodiment of a semiconductor device.
Figure 2B:
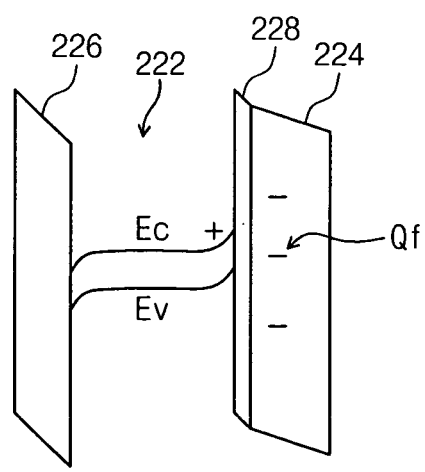
FIG. 2B illustrates an exemplary energy band diagram of the exemplary semiconductor device of FIG. 2A.

FIG. 2A illustrates a partial cross-sectional view of another exemplary embodiment of a semiconductor device 10'. FIG. 2B illustrates an exemplary energy band diagram of the exemplary semiconductor device 10' of FIG. 2A. In general, only differences between the semiconductor device 10' of FIG. 2A and the semiconductor device 10 of FIG. 1A will be described below.

Referring to FIGS. 2A and 2B, the semiconductor device 10' may include the back bias dielectric 224 including the negative fixed charge Qf, the gate electrode 230 disposed above the back bias dielectric 224, the semiconductor layer 222 disposed between the gate electrode 230 and the back bias dielectric 224, and the gate dielectric 226 disposed between the semiconductor layer 222 and the gate electrode 230. The negative fixed charge Qf may accumulate holes, e.g., at a surface of the semiconductor layer 222 facing the back bias dielectric 224.

Referring to FIG. 2A, the semiconductor device 10' may include a buried insulating layer 228. The buried insulating layer 228 my not include a negative fixed charge Qf. The buried insulating layer 228 may be disposed between the back bias dielectric 224 and the semiconductor layer 222. The buried insulating layer 228 may include, e.g., a silicon oxide layer. The buried insulating layer 228 may improve interfacial characteristics between the back bias dielectric 224 and the semiconductor layer 222. The buried insulating layer 228 may be a thermal oxidation layer. The buried insulating layer 228 may have a thickness less than a thickness of the back bias dielectric 224. The thickness of the buried insulating layer 228 may be equal to and/or within a range of about 0.2 nm to about 20 nm. The buried insulating layer 228 and the back bias dielectric 224 may include different materials.

Figure 3:
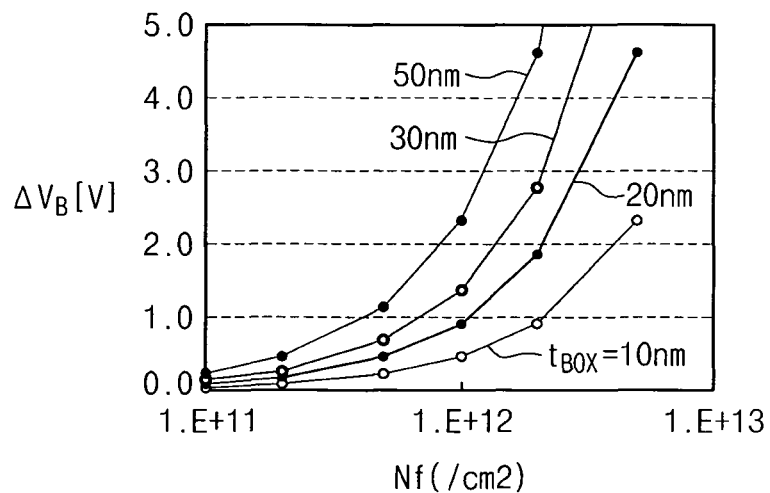
FIG. 3 illustrates a graph describing relationships between a negative fixed charge density, a thickness of a back bias dielectric, and a difference in a back bias voltage of a semiconductor device.

FIG. 3 illustrates a graph describing relationships between a negative fixed charge density, a thickness of a back bias dielectric, and a difference in a back bias voltage of a semiconductor device, e.g., 10, 10' of FIGS. 1A and 2A, respectively.

Referring to FIG. 3 and Equation 1, the change $\Delta V_{th}$ in the threshold voltage of the semiconductor device, e.g., 10, 10', generally depends on the difference $\Delta V_B$ in the back bias voltage of the semiconductor device 10, 10'. The difference $\Delta V_B$ in the back bias voltage may depend on a negative fixed surface charge density Nf and a thickness $T_{BOX}$ of the back bias dielectric 224. Referring to FIG. 3, the difference $\Delta V_B$ in the back bias voltage increases proportionally to the negative fixed surface charge density Nf and the thickness $T_{BOX}$ of the back bias dielectric 224.

Accordingly, by using a material having a negative fixed charge Nf, such as the back bias dielectric 224, an effect of applying a negative voltage to a back gate may be obtained without applying a negative voltage to the back gate.

Figure 4:
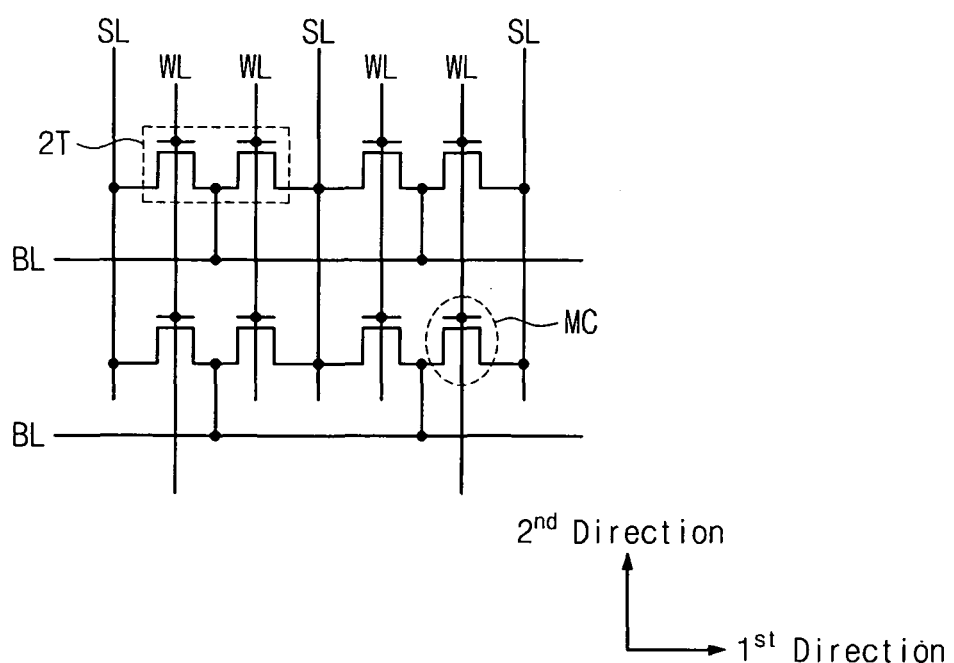
FIG. 4 illustrates a circuit diagram of an exemplary embodiment of a semiconductor device.
Figure 5A:
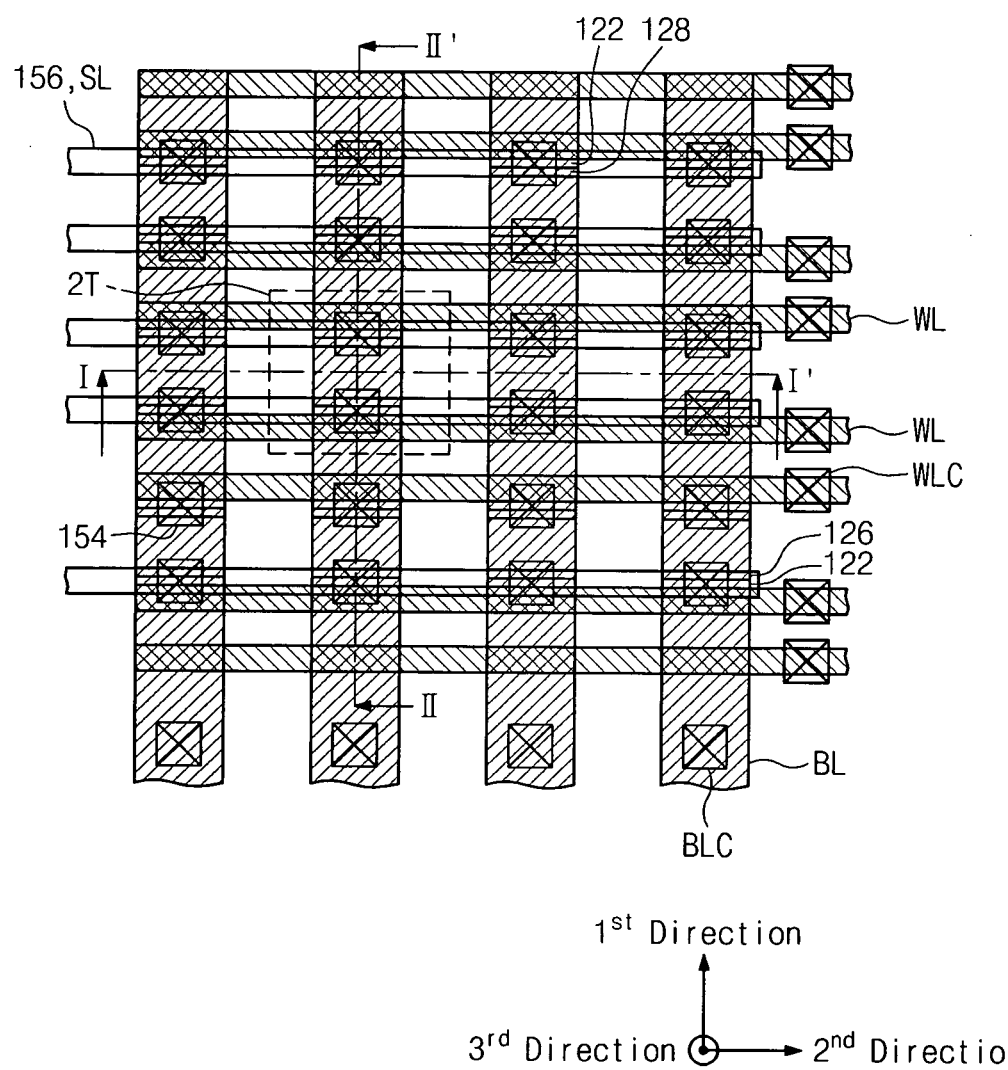
FIG. 5A illustrates an exemplary layout diagram of the exemplary semiconductor device of FIG. 4.
Figure 5B:
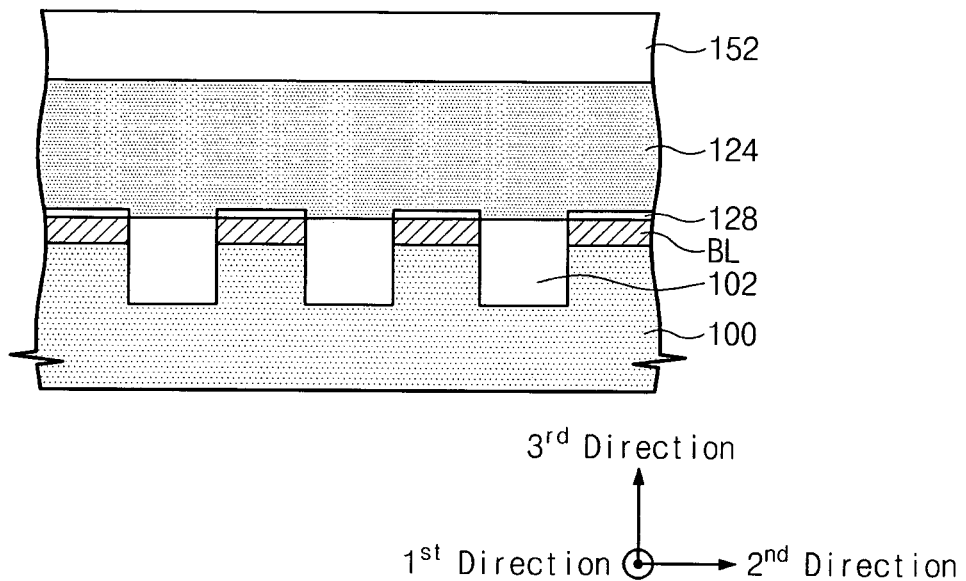
FIG. 5B illustrates a cross-sectional view of the exemplary semiconductor device of FIG. 4, along line I-I' of FIG. 5A.
Figure 5C:
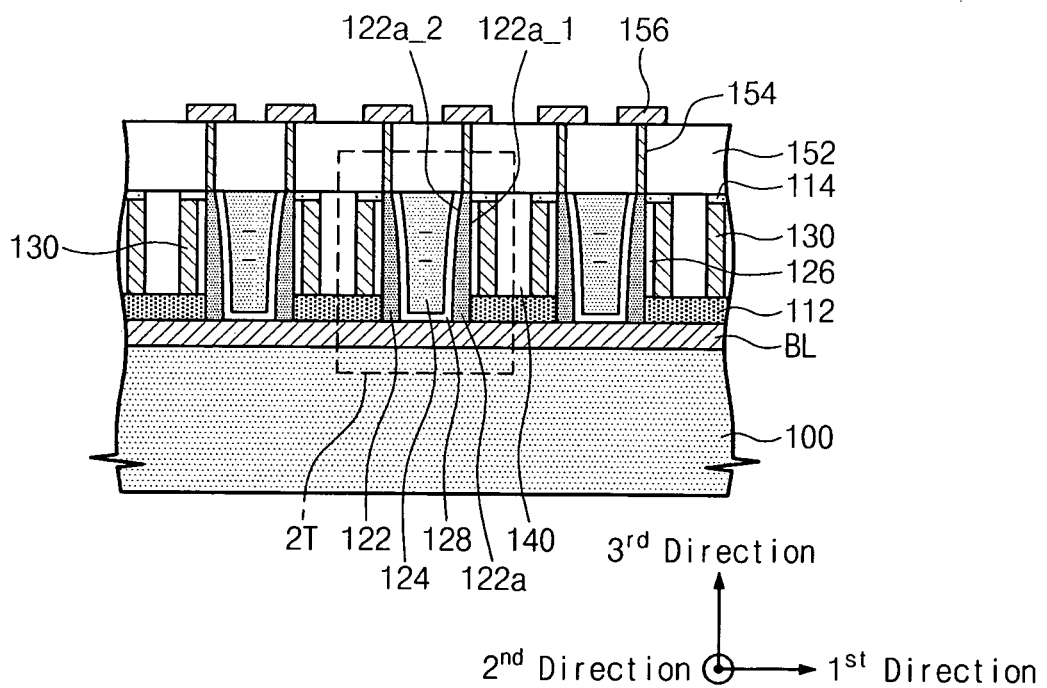
FIG. 5C illustrates a cross-sectional view of the exemplary semiconductor device of FIG. 4, along line II-II' of FIG. 5A.

FIG. 4 illustrates a circuit diagram of an exemplary embodiment of a semiconductor device, e.g., DRAM array, employing one or more of the features described above with regard to FIGS. 1A, 1B, 2A, and 2B. FIG. 5A illustrates an exemplary layout diagram of the exemplary semiconductor device of FIG. 4. FIG. 5B illustrates a cross-sectional view of the exemplary semiconductor device of FIG. 4, along line I-I' of FIG. 5A. FIG. 5C illustrates a cross-sectional view of the exemplary semiconductor device of FIG. 4, along line II-II' of FIG. 5A. Features of the exemplary semiconductor device shown in FIG. 4 and an exemplary method for forming, e.g., the semiconductor device of FIG. 4 will be described below with regard to FIGS. 4, 5A, 5B, and 5C.

More particularly, e.g., the semiconductor device 10, 10' of FIGS. 1A and 2A, respectively, may be employed as a 1-T DRAM of a DRAM array. That is, e.g., the DRAM array may include a plurality of memory cells MC, and each of the plurality of memory cells MC may include a transistor.

In the DRAM array, a pair of the memory cells 2T may be connected in series. That is, e.g., the drains of the transistors may be connected in series. The memory cells MC may be arranged in a mirror symmetric fashion in a first direction.

The memory cells MC may be regularly arranged in a second direction crossing the first direction. Bit lines BL may be connected with the drains of the transistors and may extend along the first direction. Word lines WL may be connected with gate electrodes of the transistors and may extend in the second direction. Source lines SL may be connected with the sources of the transistors and may extend in the second direction. Storing and reading of information in and from a selected one of the memory cells MC may be performed by selecting corresponding ones of the word lines WL, the bit lines BL and the source lines SL.

More particularly, referring to FIGS. 4, 5A, 5B, and 5C, each of the transistors of, e.g., the DRAM array, may include, e.g., a semiconductor layer 122, a back bias dielectric 124 including a fixed charge, a gate dielectric 126, a gate electrode 130, and source/drain regions S/D (see, e.g., FIGS. 1A, 2A). Referring still to FIGS. 5A, 5B, and 5C, the semiconductor device may include a semiconductor substrate 100, a device isolation layer 102, a lower dielectric pattern 112, an upper dielectric pattern 114, a buried dielectric 128, a gap fill dielectric 140, an interlayer dielectric 152, a source line contact plug 154, a bit line BL, a source line 156, a bit line contact plug BLC and/or a word line contact plug WLC.

Referring to FIG. 5B, the device isolation layer 102 may extend in the first direction and may extend within a groove formed in the semiconductor substrate 100. The semiconductor substrate 100 may be a silicon substrate. The device isolation layer 102 may extend parallel to the first direction and respective portions thereof may be spaced at a constant distance relative to each other, e.g., a striped pattern. The device isolation layer 102 may include a silicon oxide layer. The device isolation layer 102 may extend between and may partially define an arrangement of one or more of the bit lines BL. The bit line BL may be disposed between the adjacent ones of the device isolation layers 102. A top surface of the bit line BL may be coplanar with a top surface of a corresponding portion of the device isolation layer 102.

The bit line BL may include a doped impurity region. The bit line BL may include the drain region of the transistor. The bit line may have a multi-layer structure. For example, the bit line BL may have a multi layer structure, e.g., a dual layer structure of a metal layer/a doped silicon layer.

Referring to FIG. 5C, the gate electrodes 130 of the transistors may extend in a third direction, e.g., vertically, relative to the semiconductor substrate 100. The gate electrodes 130 may be arranged on the lower dielectric layer 112. More particularly, in the exemplary embodiment of FIG. 5C, two adjacent ones of the gate electrodes 130 are arranged on each of the lower dielectric patterns 112. The gap filling dielectric 140 may be arranged between the two adjacent ones of the gate electrodes 130 on a same one of the lower dielectric patterns 112, and may electrically isolate the adjacent ones of the gate electrodes 130.

The semiconductor layer 122 may include a plurality of semiconductor structures 122a protruding upward relative to the semiconductor substrate 100, e.g., extending in a third direction, e.g., vertically, relative to the semiconductor substrate 100. The semiconductor structures 122a may be disposed on the corresponding bit lines BL. The semiconductor structures 122a may electrically contact the corresponding bit line BL. The semiconductor structure 122a may be a doped silicon layer. The semiconductor structures 122a may have a conductive type that is different from a conductive type of the drain region a corresponding transistor. The semiconductor structure 122a may have a plate type rectangular parallelepiped structure. A thickness or width of the semiconductor structure 122a may change, e.g., decrease, from a bottom portion to a top portion thereof. For example, an upper portion of the semiconductor structure 122a may be thinner and/or wider than a lower portion of the semiconductor structure 122a. A thickness or width of an upper portion of the back bias dielectric 124 along, e.g., the first direction may be wider than a thickness or width of a lower portion of the back bias dielectric 124.

More particularly, referring to FIG. 5C, a plurality, e.g., a pair, of the semiconductor structures 122a may be electrically connected to and/or arranged on each of the bit lines BL. In such embodiments, the back bias dielectric 124 may be arranged between each of the pairs of the semiconductor structures 122a.

That is, e.g., the gate electrodes 130 may be disposed at first sides 122a_1 of the semiconductor structures 122a of the semiconductor layer 122. The back bias dielectric 124 may be disposed at second sides 122a_2 of the semiconductor structures 122a of the semiconductor 122.

More particularly, e.g., the gate electrodes 130 may extend in the second direction crossing the first direction. The gate dielectric 126 may be disposed between the corresponding ones of the gate electrodes 130 and the semiconductor structures 122a. For example, the first sides 122a_1 of the semiconductor structures of the semiconductor layer 122 may face the corresponding one of the gate electrodes 130, and the second sides 122a_2, e.g., opposite to the first side 122a_1, may face the corresponding back bias dielectric 124. In such embodiments, the gate dielectric 126 may be arranged between the first sides 122a_1 of the semiconductor structures 122a and the corresponding gate electrode 130. Further, the buried dielectric 128 may be arranged between the second sides 122a_2 of the semiconductor structures 122a and the corresponding back bias dielectric 124.

The back bias dielectric 124 may extend along the second direction. Corresponding ones/portions of the gate electrodes 130, the gate dielectrics 126, the semiconductor structures 122a and the back bias dielectrics 124 may constitute one transistor, e.g., each of the transistors of, e.g., the DRAM array. In embodiments, e.g., exemplary embodiment of FIGS. 5A, 5B, 5C, a pair of the transistors 2T may be arranged symmetrically centered on the back bias dielectric 124, e.g., arranged on opposite sides of the back bias dielectric 124.

More particularly, as discussed above, in some embodiments, the back bias dielectric 124 may be disposed on the second side 122a_2 of the corresponding semiconductor structure 122a. The gate dielectric 126 and the gate electrode 130 may be sequentially disposed on the first side 122a_1 the semiconductor structure 122a. A top surface of the semiconductor structure 122a may be coplanar with a top surface of the corresponding back bias dielectric 124.

The back bias dielectric 124 may include a negative fixed charge Qf at a surface thereof and/or in a body thereof. The negative fixed charge Qf may accumulate a hole on a surface of the corresponding semiconductor structure 122a. The negative fixed charge Qf of the back bias dielectric 124 may change a threshold voltage Vth of the transistor. The negative fixed charge Qf of the back bias dielectric 124 may provide an effect of applying a back bias voltage VB to the corresponding transistor, e.g., corresponding transistor of a DRAM array. In some embodiments, e.g., the negative fixed charge Qf may be formed, e.g., by implanting halogen group ions into the back bias dielectric 124. In some embodiments, the negative fixed charge Qf of the back bias dielectric 124 may be formed according to a condition for forming the back bias dielectric 124. For example, the back bias dielectric 124 may include an aluminum oxide layer, a titanium oxide layer, a tantalum oxide layer, a zirconium oxide layer, a hafnium oxide layer, a hafnium silicon oxide layer, and/or a zirconium silicon oxide layer, etc.

The gate dielectric 126 may include a silicon oxide layer. The gate dielectric 126 may be disposed at a central portion of the corresponding semiconductor structure 122*a*.

The gate electrode 130 may be disposed on the corresponding gate dielectric 126. Along the second and third directions, the gate electrode 130 and the gate dielectric 126 may completely overlap each other. For example, the gate electrode 130 and the gate dielectric 126 may be sandwiched between the upper dielectric pattern 114 and the lower dielectric pattern 112. The gate electrode 130 may extend in the second direction and may correspond to the word line WL.

More particularly, referring to FIG. 5C, the upper dielectric pattern 114 may be disposed on the gate dielectric 126 and the gate electrode 130. A top surface of the upper dielectric pattern 114 may be substantially coplanar with the top surface of the corresponding semiconductor structure 122*a*. The upper dielectric pattern 114 may extend in the second direction. The upper dielectric pattern 114 may include a silicon nitride layer, a silicon oxynitride layer and/or a silicon oxide layer, etc.

The lower dielectric pattern 112 may be disposed beneath the gate dielectric 126 and the gate electrode 130. The lower dielectric pattern 112 may extend in the second direction. The lower dielectric pattern 112 may include a silicon nitride layer, a silicon oxynitride layer and/or a silicon oxide layer, etc. The upper dielectric pattern 114 and the lower dielectric pattern 112 may be formed of a same material.

The gap fill dielectric 140 may be disposed between adjacent ones of the gate electrodes 130, e.g., between adjacent ones of the gate electrodes arranged on a same portion of the lower dielectric pattern 112. The gap fill dielectric 140 may include a silicon oxide layer. The gap fill dielectric 140 may be disposed on the lower dielectric pattern 112. The gap fill dielectric 140 may extend in the second direction. A top surface of the gap fill dielectric 140 may be substantially coplanar with the top surface of the back bias dielectric 124.

The interlayer dielectric 152 may be disposed on the back bias dielectric 124 and the gap fill dielectric 140. The interlayer dielectric 152 may be a silicon oxide layer. A top surface of the interlayer dielectric 152 insulating layer may be planarized.

The source line contact plug 154 may disposed on the semiconductor structure 122*a* while penetrating the interlayer dielectric 152. An upper portion of the semiconductor structure 122*a* may be doped with an impurity so as to form a source region. A conductivity type of the impurity may be opposite to a conductivity type of the semiconductor structure 122*a*. The source line contact plug 154 may include, e.g., a doped polysilicon, a metal and/or a conductive metal compound, etc.

The source line 156 may be disposed on the interlayer dielectric 152 and may extend in the second direction. The source line 156 may be electrically connected with the source line contact plug 154. The source line 156 may include, e.g., a metal and/or a conductive metal compound, etc.

The word line contact plug WLC may be disposed on the word line WL and may penetrate the interlayer dielectric 152 and the upper dielectric pattern 114. The word line contact plug WLC may be electrically connected with a metal interconnection (not shown).

The bit line contact plug BLC may be disposed on the bit line BL while penetrating the interlayer dielectric 152, the gap fill dielectric 140, and the lower dielectric pattern 112. The bit line contact plug BLC may be electrically connected with a metal interconnection (not shown).

The buried dielectric 128 may be disposed between the vertical semiconductor structure 122 and the back bias dielectric 124. The buried dielectric 128 may not include a negative fixed charge. The buried dielectric 128 may include a silicon oxide layer. The buried dielectric 128 may be formed by selectively oxidizing one side surface of the vertical semiconductor structure 122. The buried dielectric 128 may have a thickness equal to and/or ranging from about 0.2 nm to about 20 nm. The thickness of the buried dielectric 128 may be less than that of the back bias dielectric 124. The buried dielectric 128 may improve interfacial characteristics between the back bias dielectric 124 and the vertical semiconductor structure 122. The buried dielectric 128 may include, e.g., a thermal oxidation layer.

FIGS. 6A, 7A, 8A, 9A, 10A, 11A, 12A, 13A, 14A, 15A, 16A, and 17A illustrate exemplary layout diagrams of stages of a semiconductor device according to an exemplary embodiment of a method of forming a semiconductor device. FIGS. 6B, 7B, 8B, 9B, 10B, 11B, 12B, 13B, 14B, 15B, 16B, and 17B illustrate cross-sectional views, along lines I-I', of the exemplary stages of FIGS. 6A, 7A, 8A, 9A, 10A, 11A, 12A, 13A, 14A, 15A, 16A, and 17A, respectively. FIGS. 6C, 7C, 8C, 9C, 10C, 11C, 12C, 13C, 14C, 15C, 16C, and 17C illustrate cross-sectional views, along line II-II', of FIGS. 6A, 7A, 8A, 9A, 10A, 11A, 12A, 13A, 14A, 15A, 16A, and 17A, respectively.

Figure 6A:
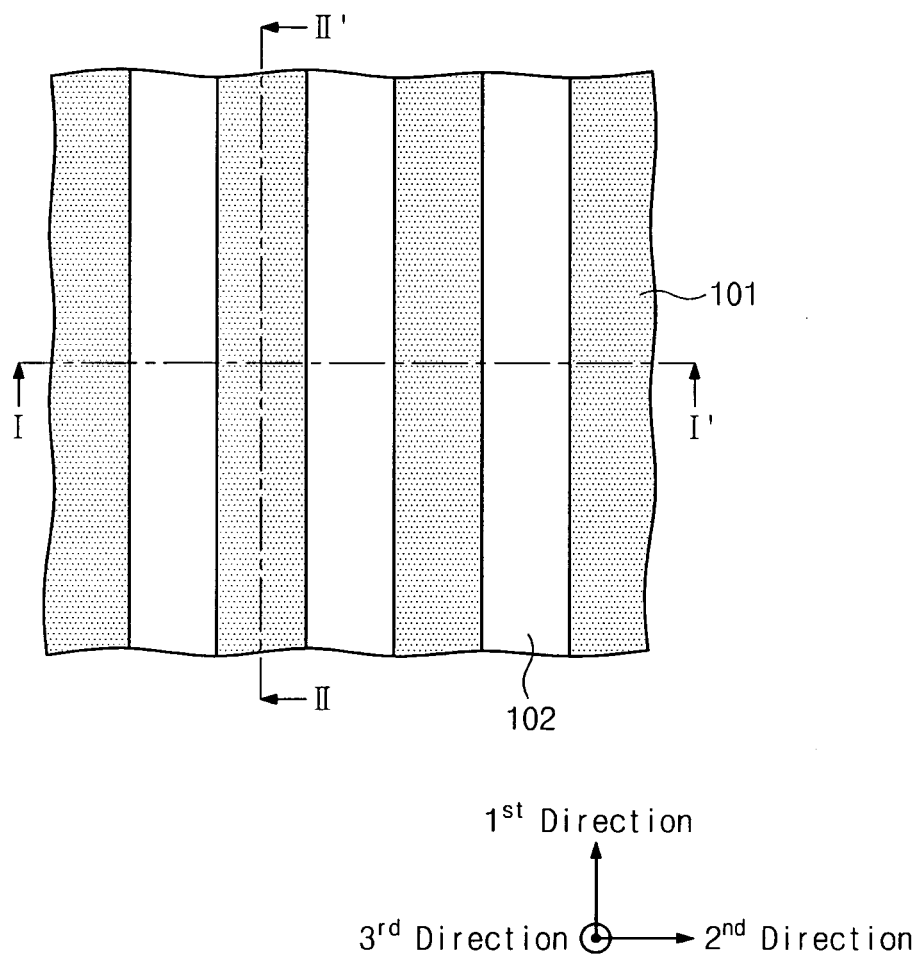
FIGS. 6A, 7A, 8A, 9A, 10A, 11A, 12A, 13A, 14A, 15A, 16A, and 17A illustrate exemplary layout diagrams of stages of a semiconductor device according to an exemplary embodiment of a method of forming a semiconductor device.
Figure 6B:
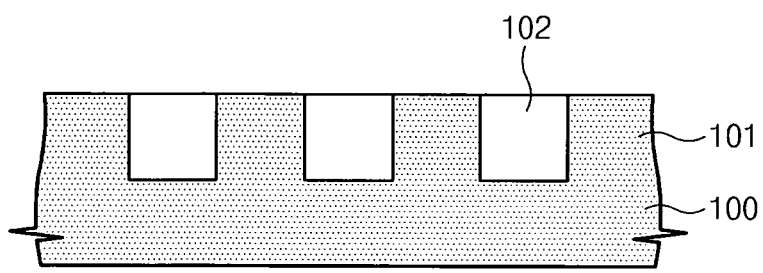
FIGS. 6B, 7B, 8B, 9B, 10B, 11B, 12B, 13B, 14B, 15B, 16B, and 17B illustrate cross-sectional views, along lines I-I', of the exemplary stages of FIGS. 6A, 7A, 8A, 9A, 10A, 11A, 12A, 13A, 14A, 15A, 16A, and 17A, respectively.
Figure 6C:
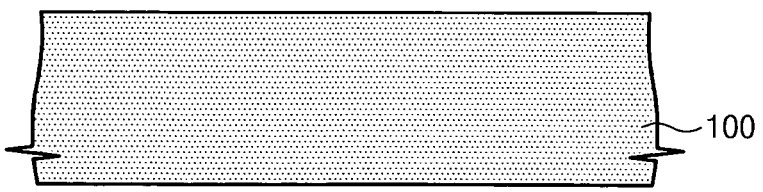
FIGS. 6C, 7C, 8C, 9C, 10C, 11C, 12C, 13C, 14C, 15C, 16C, and 17C illustrate cross-sectional views, along line of FIGS. 6A, 7A, 8A, 9A, 10A, 11A, 12A, 13A, 14A, 15A, 16A, and 17A, respectively.

Referring to FIGS. 6A, 6B, and 6C, the device isolation layer 102 may be formed in a semiconductor substrate 100. The device isolation layer 102 may be formed by a shallow trench isolation (STI) process. The device isolation layer 102 may define an active region 101. A top surface of the active region 101 may be substantially coplanar with a top surface of the device isolation layer 102. The device isolation layer 102 may include a silicon oxide layer. The device isolation layer 102 may extend in a first direction. The device isolation layer 102 may include a plurality of portions arranged parallel to each other and spaced apart from each other by a predetermined distance.

Figure 7A:
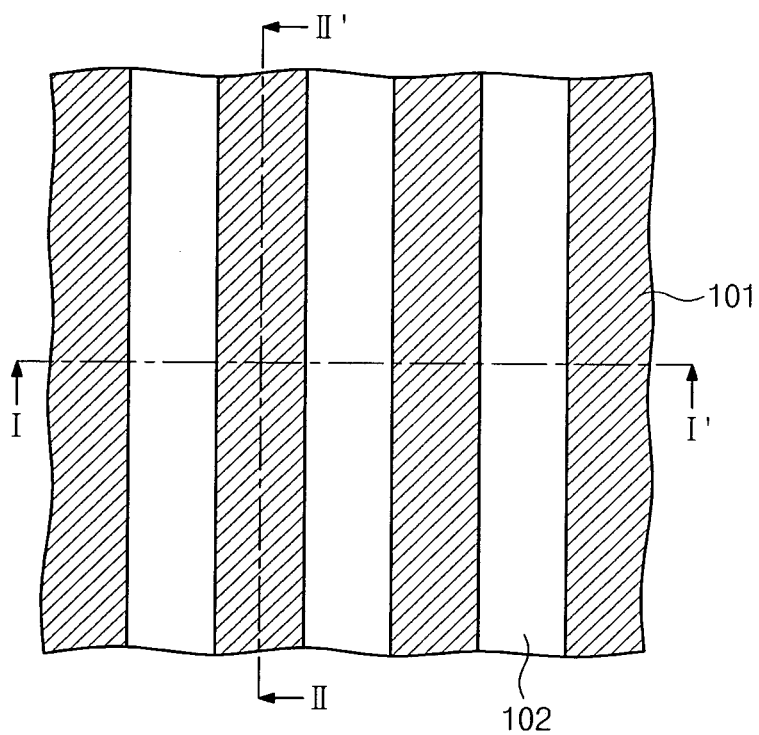
Figure 7A:
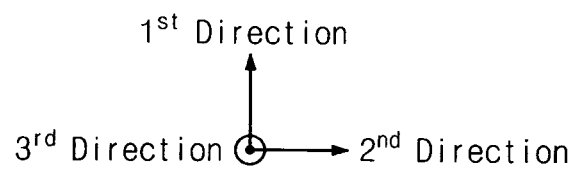
Figure 7B:
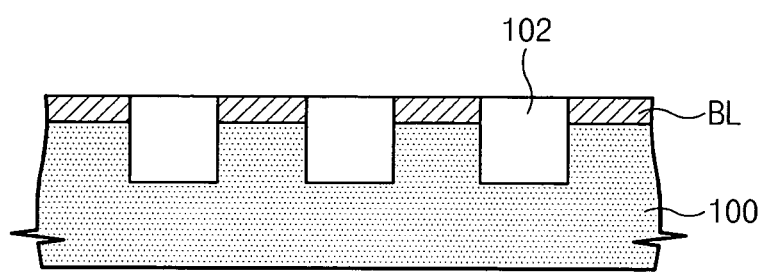
Figure 7C:
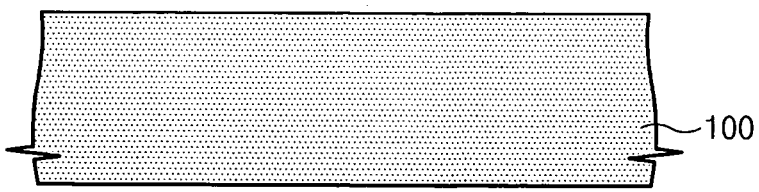

Referring to FIGS. 7A, 7B, and 7C, an upper portion of the active region 101 may be doped with an impurity to form a bit line BL. The bit line may have a multi-layer structure. For example, the bit line BL may have a multi-layer structure, e.g., a dual layer structure including a metal layer and a doped silicon layer. The bit line may extend in the first direction. The bit line BL may include a drain region of a transistor.

Figure 8A:
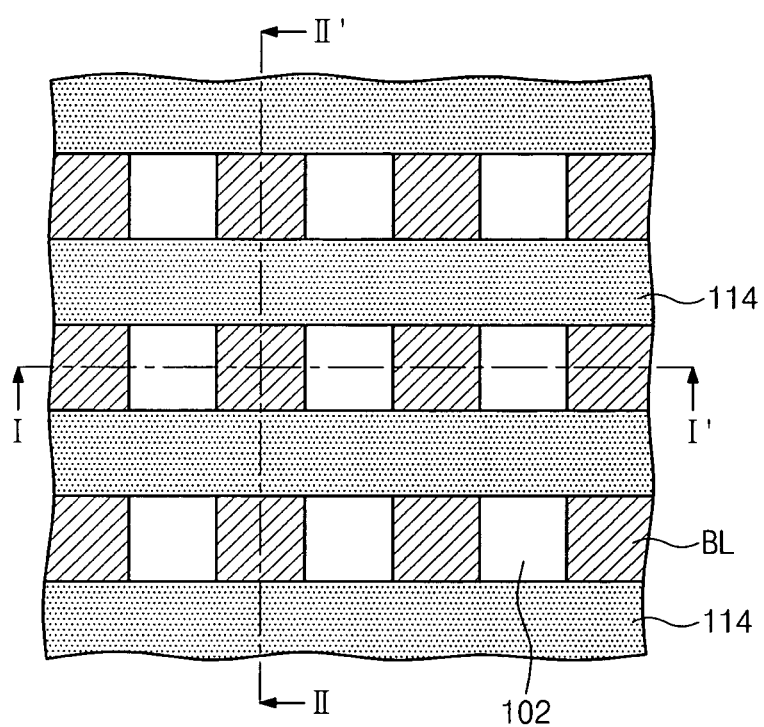
Figure 8B:
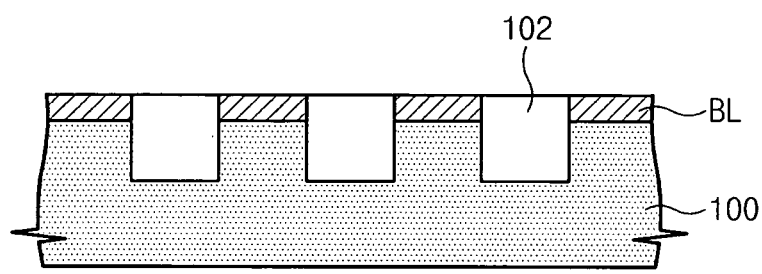
Figure 8C:
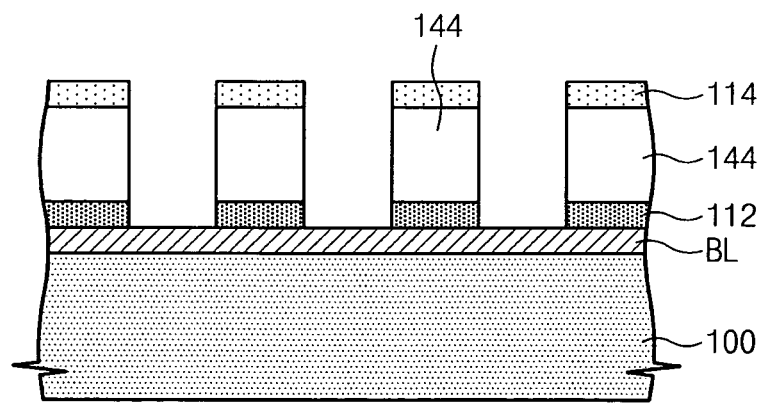

Referring to FIGS. 8A, 8B, and 8C, a lower dielectric (not shown), a dummy dielectric (not shown) and an upper dielectric (not shown) may be sequentially stacked on the device isolation layer 102 and the bit line BL. The lower dielectric may include, e.g., a silicon nitride layer, a silicon oxide layer and/or a silicon oxynitride layer, etc. The dummy dielectric may include a silicon oxide layer, a silicon nitride layer and/or a silicon oxynitride layer, etc. The upper dielectric may include a silicon nitride layer, a silicon oxide layer and/or a silicon oxynitride layer, etc. The lower dielectric and the upper dielectric may be formed of the same material.

Thereafter, the upper dielectric, the dummy dielectric and the lower dielectric may be patterned to form the upper dielectric pattern 114, the dummy dielectric pattern 144 and the lower dielectric pattern 112, respectively. The upper dielectric, the dummy dielectric, and the lower dielectric may be patterned during a same process, e.g., may be simultaneously patterned. The upper dielectric pattern 114, the dummy dielectric pattern 144 and the lower dielectric pattern 112 may extend in the second direction.

Figure 9A:
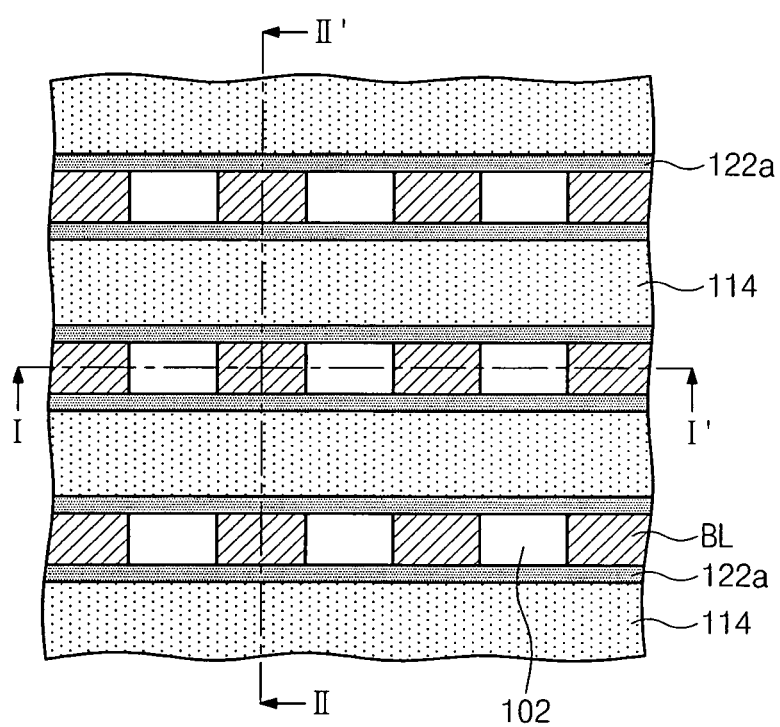
Figure 9B:
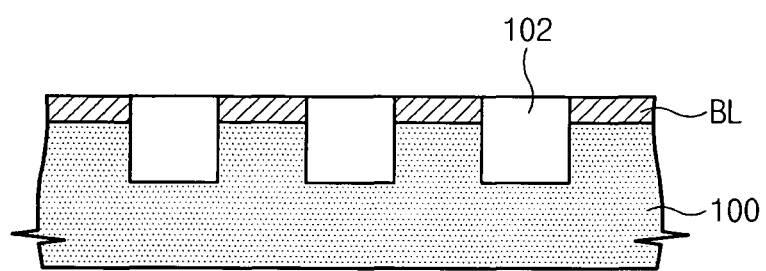
Figure 9C:
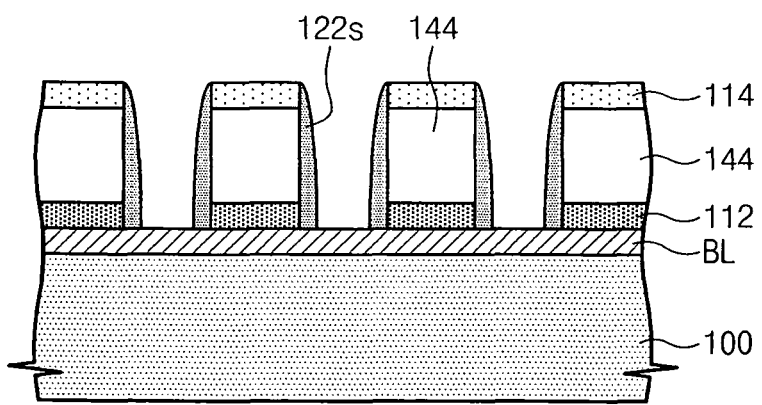

Referring to FIGS. 9A, 9B, and 9C, a semiconductor layer (not shown) may be conformally formed on the semiconductor substrate 100 having the lower dielectric pattern 112 formed thereon. The semiconductor layer may be etched using an anisotropic etch method to form a sidewall 122s. The semiconductor layer may be an amorphous silicon layer, a polysilicon layer or a crystalline silicon layer. The semiconductor layer may be doped with an impurity.

The sidewalls 122s may be disposed on respective side surfaces of the upper dielectric pattern 114, the dummy dielectric pattern 144 and the lower dielectric pattern 112. When the semiconductor layer is an amorphous silicon layer, the semiconductor layer may be crystallized using a thermal annealing process or a solid state epitaxy process. The thermal annealing process may be a laser annealing process.

Figure 10A:
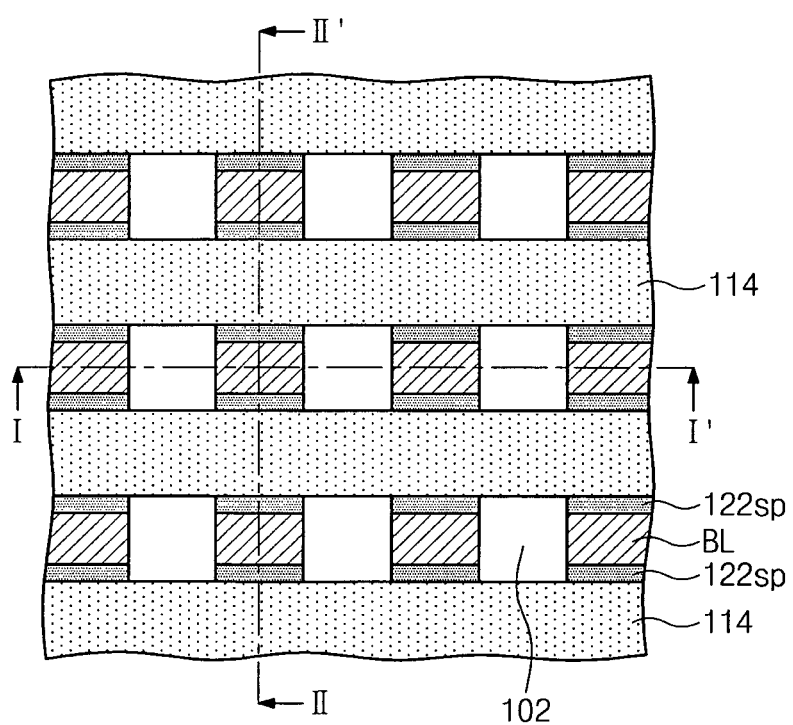
Figure 10B:
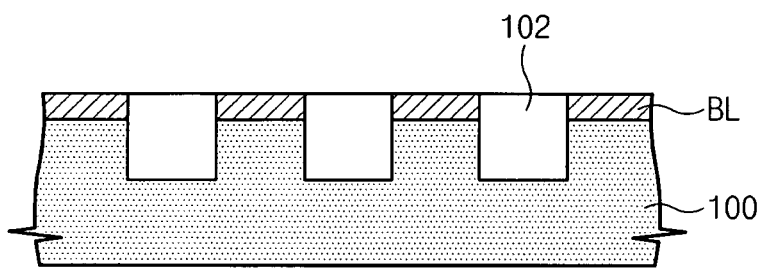
Figure 10C:
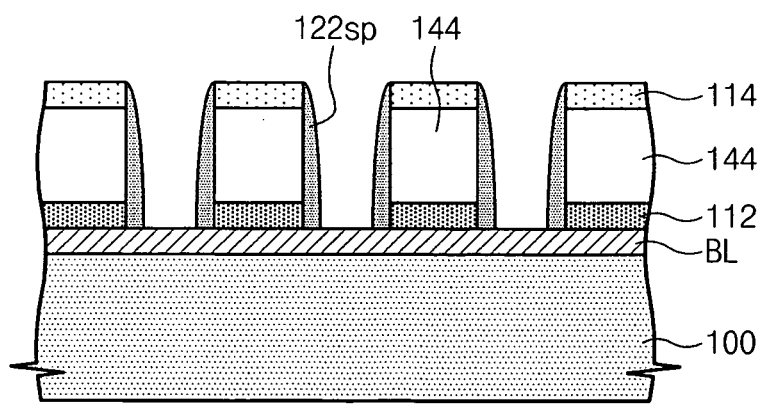

Referring to FIGS. 10A, 10B, and 10C, the sidewalls 122a may be patterned and separated from one another to form a preliminary semiconductor structure 122sp. The patterning may be performed by selectively removing portions of the sidewall 122s using, e.g., a line type photoresist disposed in the first direction as a mask. The patterning may include an anisotropic etch or isotropic etch. The preliminary semiconductor structures 122sp may be separated from one another.

Figure 11A:
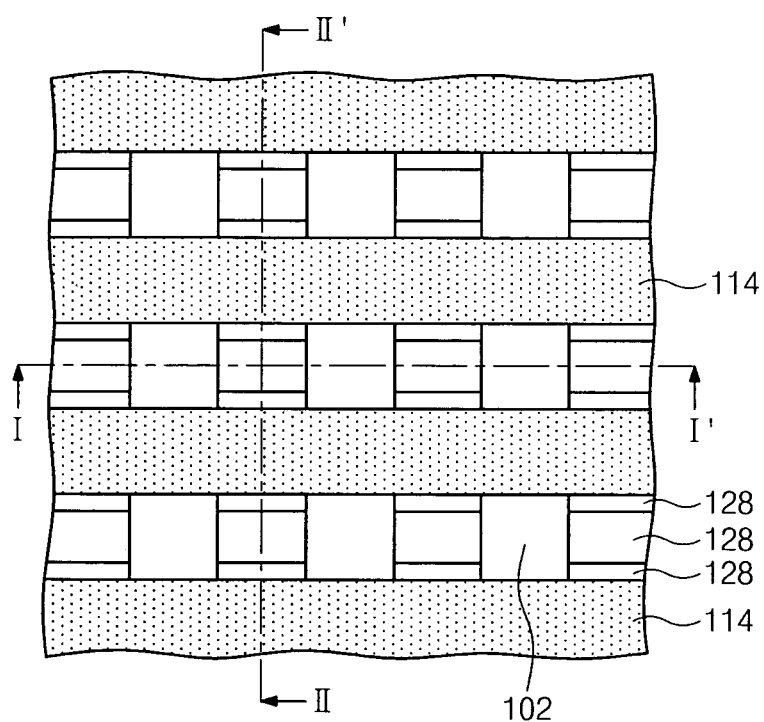
Figure 11B:
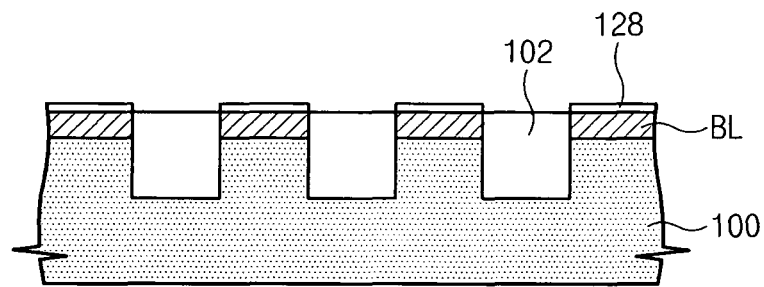
Figure 11C:
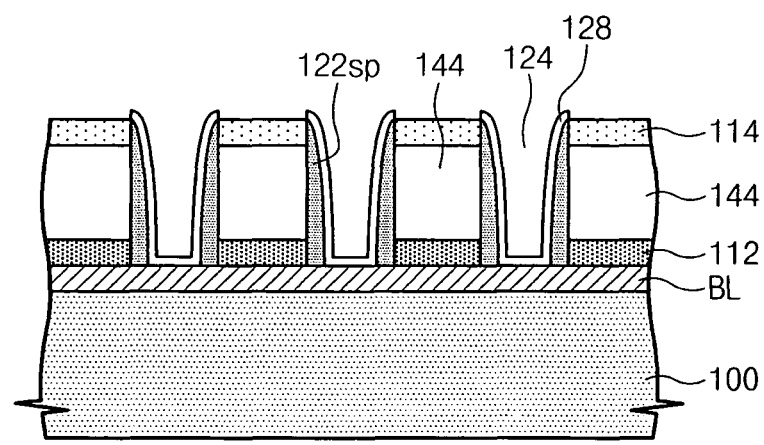

Referring to FIGS. 11A, 11B, and 11C, the buried dielectric 128 may be formed on the substrate 100 having the preliminary semiconductor structure 122sp formed thereon. The buried dielectric 128 may be a thermal oxidation layer. When the buried dielectric 128 is a thermal oxidation layer, an exposed surface of the preliminary semiconductor structure 122sp and an exposed surface of the bit line BL may be oxidized and transformed into an oxide layer. The buried dielectric 128 may have a thickness equal to and/or ranging from about 0.2 nm to about 20 nm. The buried dielectric 128 may not include a negative fixed charge.

Figure 12A:
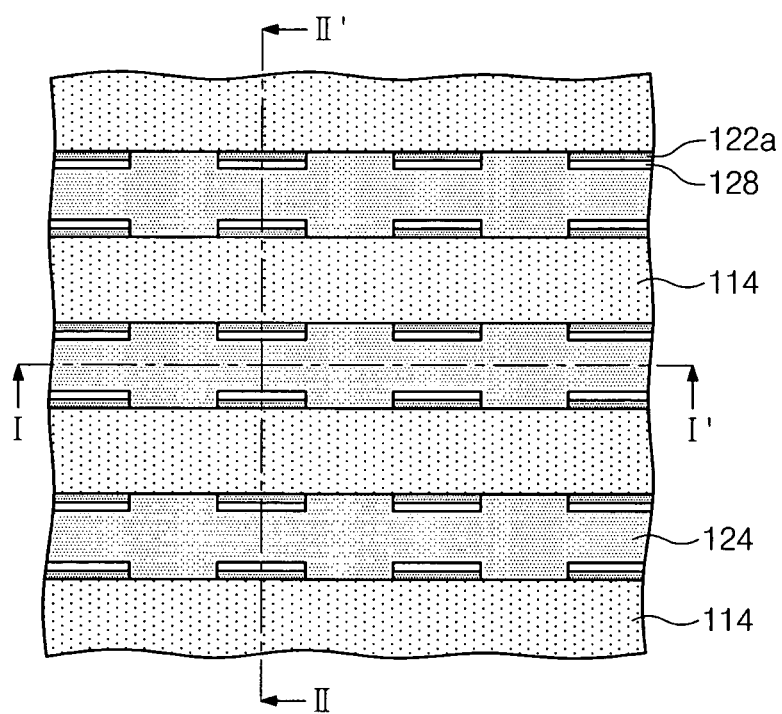
Figure 12B:
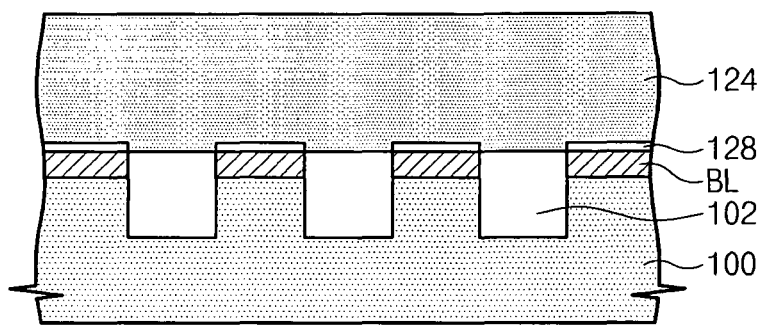
Figure 12C:
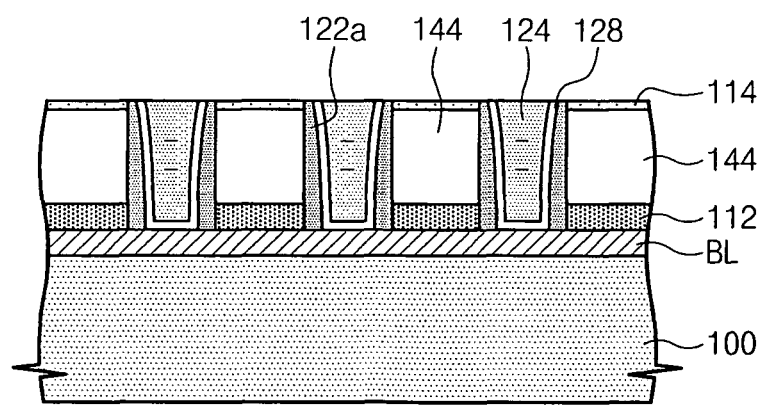

Referring to FIGS. 12A, 12B, and 12C, a back bias dielectric 124 may be formed on the semiconductor substrate 100 having the buried dielectric 128 formed thereon. The back bias dielectric 124 may include a negative fixed charge. The negative fixed charge may be positioned at an interface between the back bias dielectric 124 and the buried dielectric 128 and/or in the back bias dielectric 124.

The back bias dielectric 124 may include at least one of a silicon oxide layer, an aluminum oxide layer, a titanium oxide layer, a tantalum oxide layer, a zirconium oxide layer, a hafnium oxide layer, a hafnium silicon oxide layer, and/or a zirconium silicon oxide layer.

For example, when the back bias dielectric 124 is a silicon oxide layer, the negative fixed charge may be formed by implanting a halogen group ion. When the back bias dielectric 124 is an aluminum oxide layer, the negative fixed charge may be generated due to characteristics of the aluminum oxide layer itself. A process recipe allowing the aluminum oxide layer to have the negative fixed charge may be changed variously.

The back bias dielectric 124 may be planarized such that the upper dielectric pattern 114 is exposed. The planarizing may be performed by a chemical mechanical polishing (CMP). As a result of the planarizing, the back bias dielectric 124 may be separated from one another. The preliminary semiconductor structure 122sp may be changed into the semiconductor structures 122a by the planarizing. The back bias dielectric 124 may extend in the second direction. The back bias dielectric 124 may fill a space between the semiconductor structures 122a.

Figure 13A:
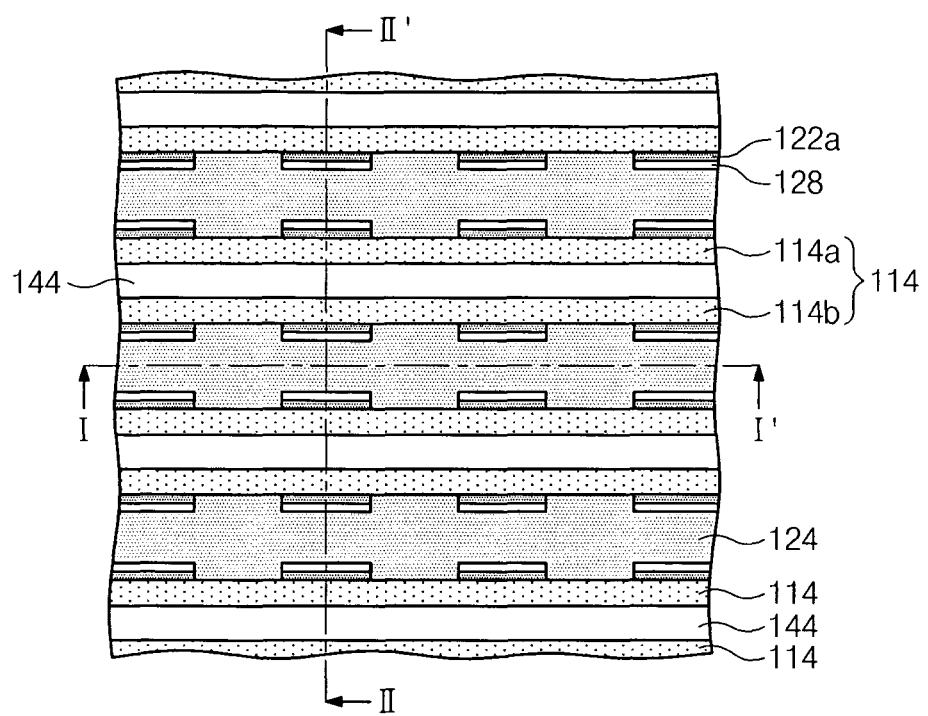
Figure 13B:
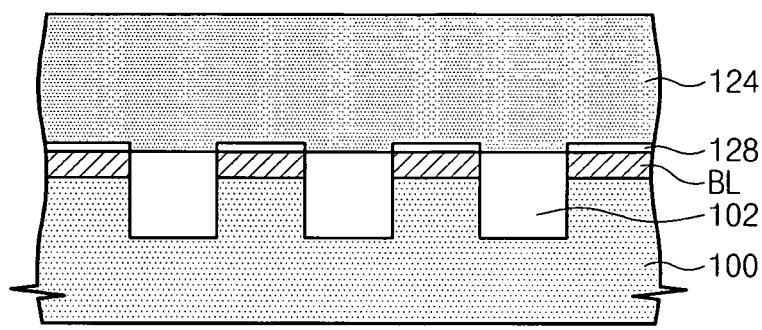
Figure 13C:
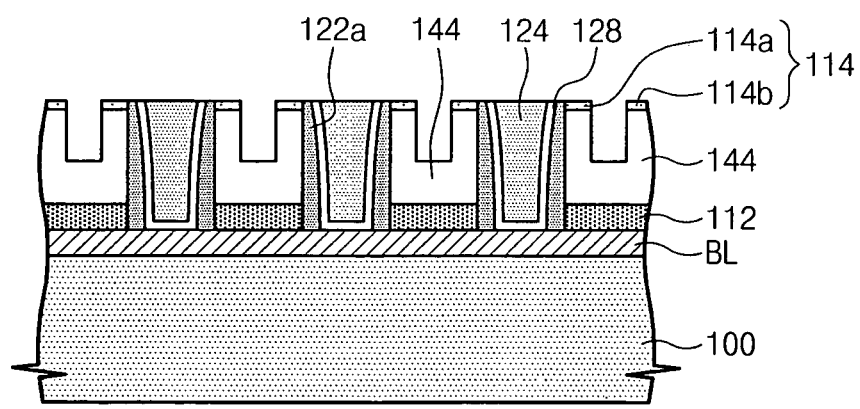

Referring to FIGS. 13A, 13B, and 13C, the upper dielectric pattern 114 and the dummy dielectric pattern 144 may be continuously patterned so that the upper dielectric pattern 114 may be separated into a first upper dielectric pattern 114a and a second upper dielectric pattern 114b. As a result of such patterning, some of the dummy dielectric pattern 144 may also be removed.

Figure 14A:
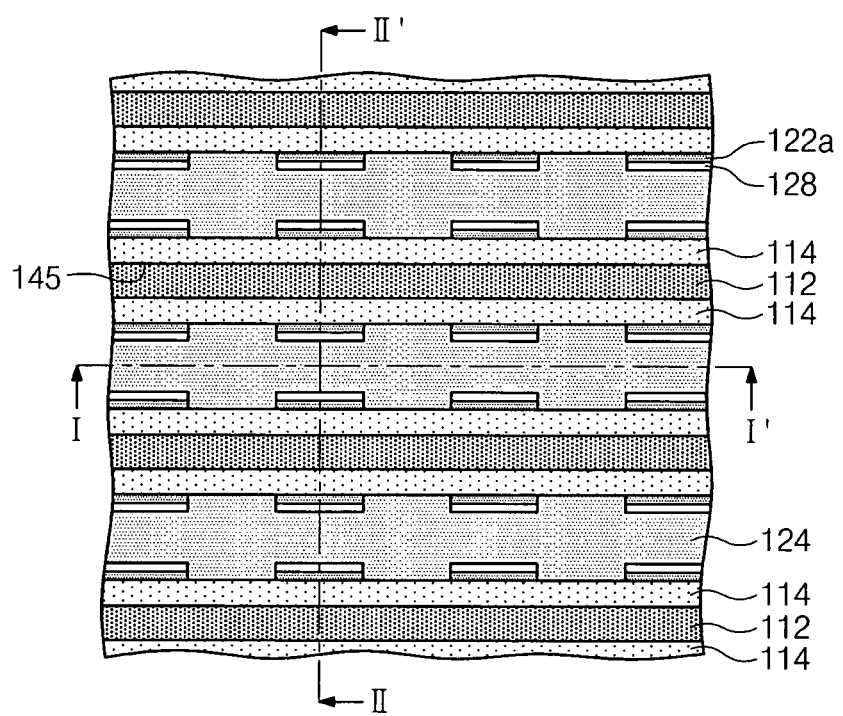
Figure 14B:
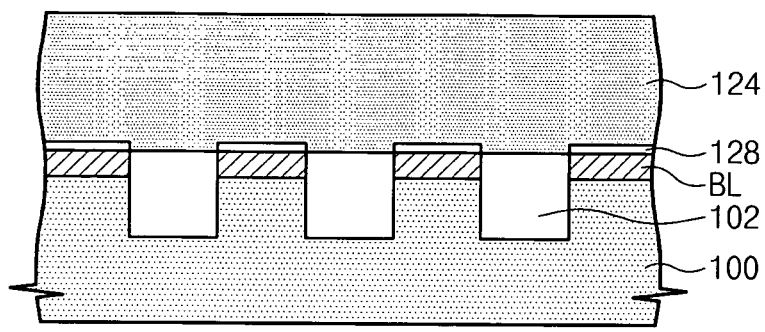
Figure 14C:
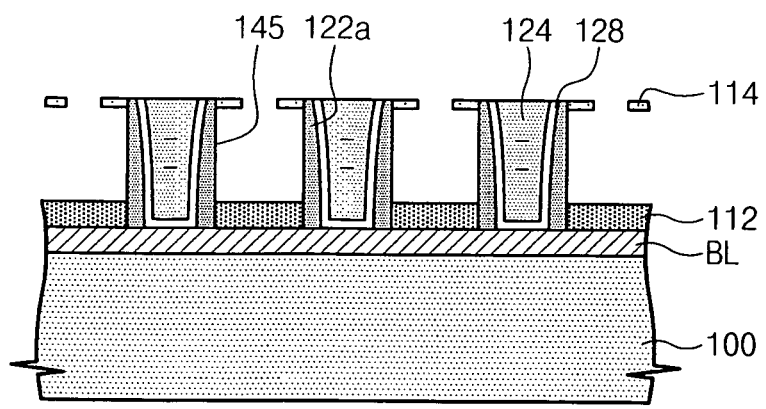

Referring to FIGS. 14A, 14B, and 14C, the dummy dielectric pattern 144, may be selectively removed. More particularly, e.g., portions of the dummy dielectric pattern 144 still remaining may be removed. For example, the dummy dielectric pattern 144 may be removed by a wet etch. A space where the dummy dielectric pattern 144 was removed from may define a cavity 145. More particularly, by removing the dummy dielectric pattern 144, the cavity 145 may be defined by portions of the semiconductor structures 122a, the lower dielectric pattern 112, the first upper dielectric pattern 114a, and/or the second upper dielectric pattern 114b.

Figure 15A:
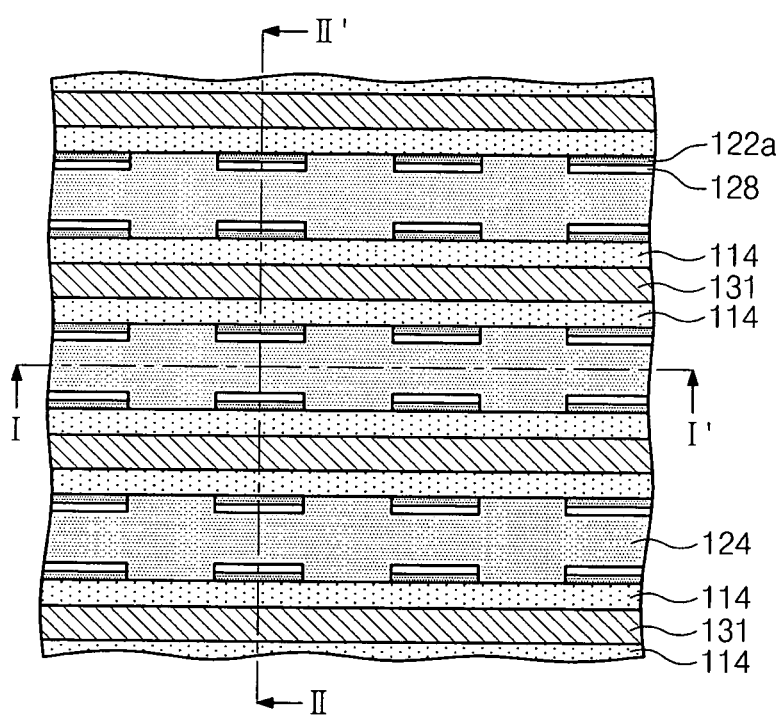
Figure 15B:
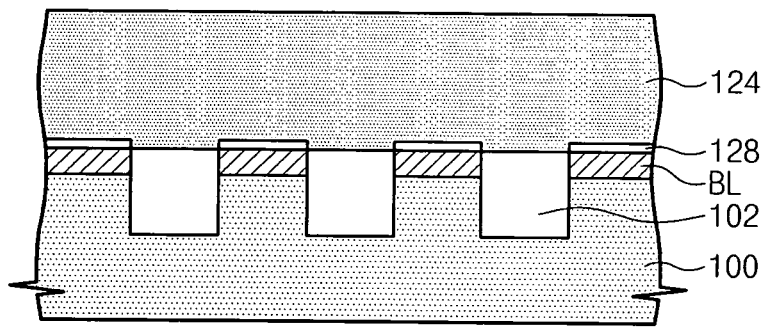
Figure 15C:
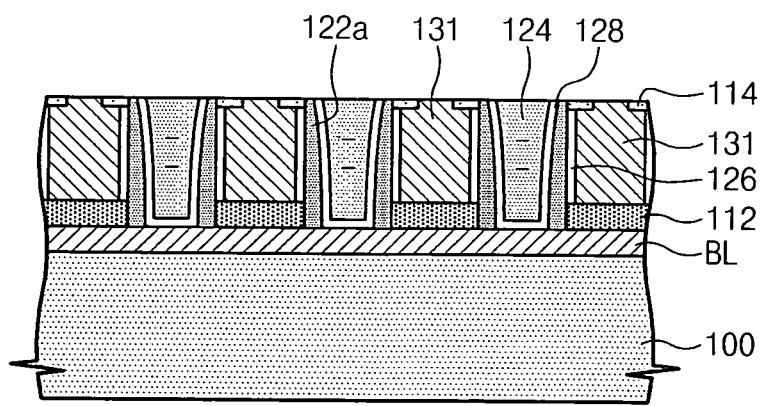

Referring to FIGS. 15A, 15B, and 15C, an oxide layer may be formed on the semiconductor substrate 100 having the cavity 145. The oxide layer may be a thermal oxidation layer. The oxide layer may be formed on a surface of the semiconductor structures 122a exposed by the cavity 145 and/or an exposed top surface of the semiconductor structures 122a. The oxide layer may be a silicon oxide layer. The oxide layer formed on the surface of the semiconductor structure 122a exposed by the cavity 145 may correspond to the gate dielectric 126.

A conductive layer 131 may be formed on the semiconductor substrate 100 on which the oxide layer is formed. As a result, the cavity 145 may be filled with the conductive layer 131. The conductive layer 131 may include at least one of a doped polysilicon, a metal and/or a metal compound. The semiconductor substrate 100 on which the conductive layer 131 is formed may be planarized such that the upper dielectric pattern 114 is exposed. By the planarizing, the oxide layer formed on the exposed top surface of the semiconductor structure 122a may be removed.

Figure 16A:
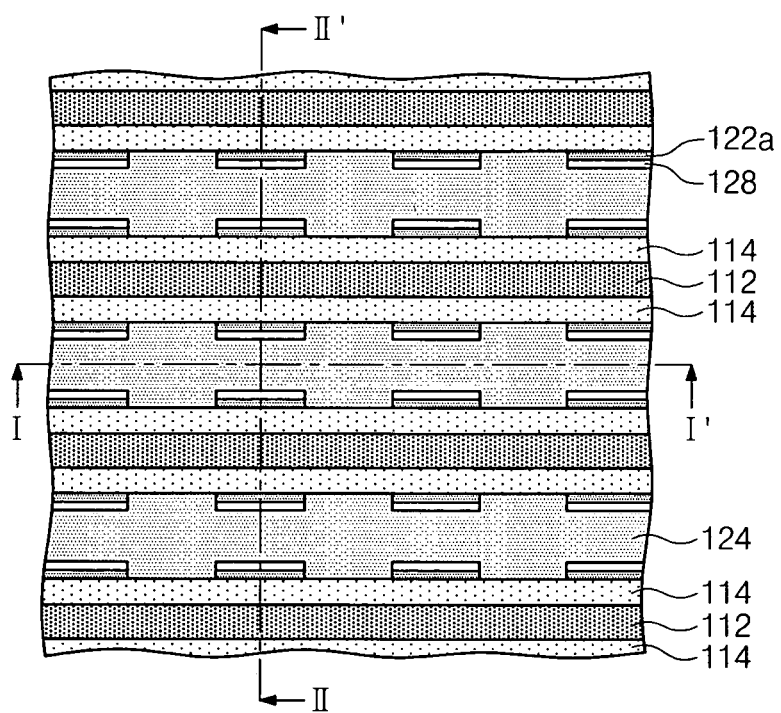
Figure 16B:
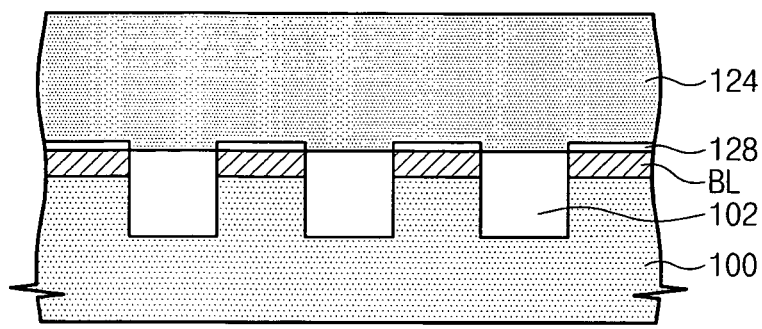
Figure 16C:
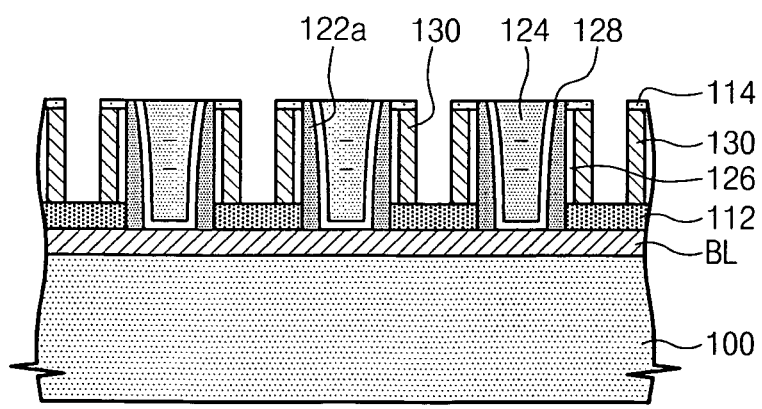

Referring to FIGS. 16A, 16B, and 16C, the conductive layer 131 in the cavity 145 may be patterned to form the gate electrode 130. The gate electrode 130 may extend in the second direction and may form the word line WL. The gate electrode 130 may be aligned with the upper dielectric pattern 114. More particularly, the gate electrode 130 may extend between the upper dielectric pattern 114 and the lower dielectric pattern 112 on a surface of the gate dielectric 126.

Figure 17A:
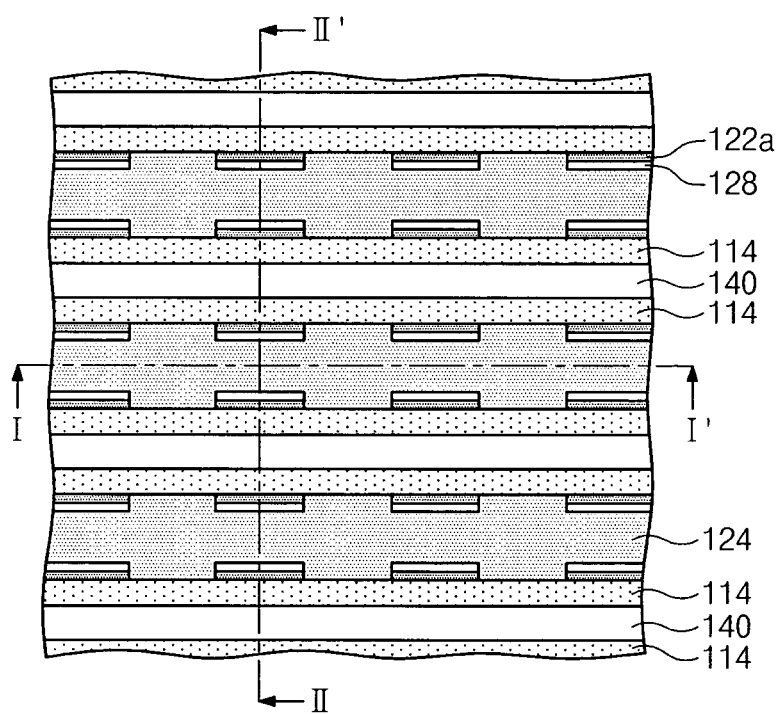
Figure 17B:
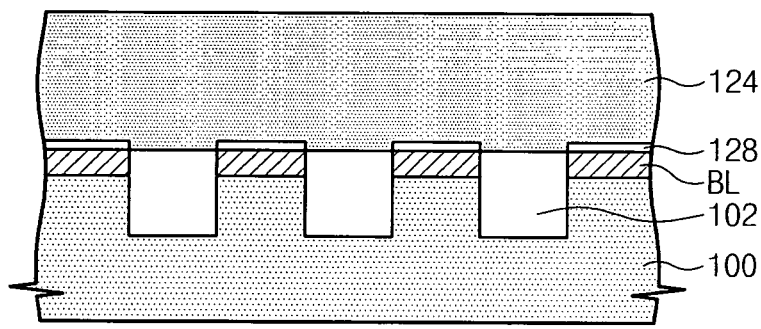
Figure 17C:
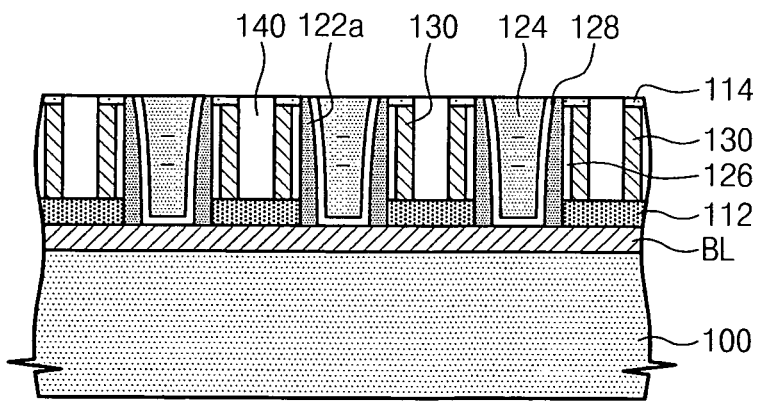

Referring to FIGS. 17A, 17B, and 17C, a space between neighboring ones gate electrodes 130 may be filled with the gap fill dielectric 140. The gap fill dielectric 140 may be a silicon oxide layer. The gap fill dielectric 140 may be planarized such that the upper dielectric pattern 114 is exposed. The top surface of the gap fill dielectric 140 may be coplanar with the top surface of the upper dielectric pattern 114.

Again referring to FIGS. 5A, 5B, and 5C, the interlayer dielectric 152 may be stacked on the gap fill dielectric 140. The interlayer dielectric 152 may be patterned to form a source line contact hole (not shown) exposing the semiconductor structure 122a. The source line contact hole may be filled with a conductive material to form the source contact plug 154. The source line 156 may extend in the second direction and may be disposed on the interlayer dielectric 152. The source line 156 may be electrically connected with the source line contact plug 154.

The interlayer dielectric 152 may have a multi-layer structure. The word line contact plug WLC may penetrate the interlayer dielectric 152 and may be connected with the word line WL. The word line contact plug WLC may be disposed at an edge of a cell region where memory cells MC are arranged. A metal interconnection (not shown) may be electrically connected with the word line contact plug WLC.

The bit line contact plug BLC may penetrate the interlayer dielectric 152 and may be connected with the bit line BL. The bit line contact plug BLC may be disposed at an edge of the cell region where memory cells are arranged. The bit line contact plug BLC may be electrically connected with a metal interconnection.

Figure 18:
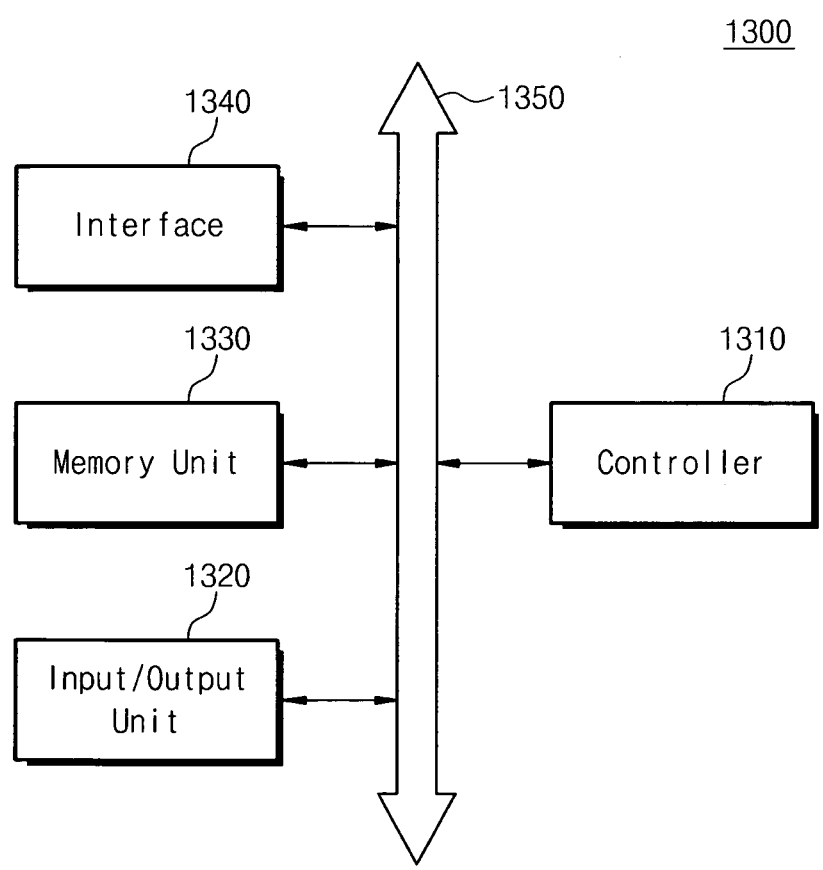
FIG. 18 illustrates a block diagram of an exemplary embodiment of an electronic system.

FIG. 18 illustrates a block diagram of an exemplary embodiment of an electronic system 1300 employing, e.g., one or more of the features described above.

Referring to FIG. 18, the electronic system 1300 may include a controller 1310, an input/output unit 1320 and a memory unit 1330. The controller 1310, the input/output unit 1320 and the memory unit 1330 may be connected to each other through a bus 1350. The bus 1350 may be a path through which data is moved. The controller 1310 may include at least one of at least one microprocessor, a digital signal processor, a microcontroller, and/or a logic device capable of performing functions similar to that of those, etc.

The input/output unit 1320 may include at least one of a keypad, a keyboard, a display device and the like. The memory unit 1330 may be configured to store data. The memory unit 1330 may store data and/or commands executed by the controller 1310. The memory unit 1330 may include at least one semiconductor devices employing one or more features described above, e.g., the semiconductor devices of FIGS. 1A, 2A, 4 and 5A-5C.

The electronic system 1300 may further include an interface 1340 for transmitting/receiving data to/from a communication network. The interface 1340 may include a wired and/or wireless interface. For example, the interface 1340 may include an antenna and/or a wired/wireless transceiver.

The electronic system 1300 may be used as a mobile system, a personal computer, an industrial computer, and/or a system capable of performing various functions, etc. For example, the mobile system may include a personal digital assistant (PDA), a portable computer, a web tablet, a mobile phone, a wireless phone, a laptop computer, a memory card, a digital music system, and/or an information transmission/reception system, etc. If the electronic system 1300 can perform a wireless communication, the electronic system 1300 may be used for a communication interface protocol such as a third generation communication system such as CDMA, GSM, NADC, E-TDMA, WCDMA, and/or CDMA2000, etc.

In embodiments, the semiconductor device may be configured to have a 1-T DRAM cell transistor including a back bias dielectric having a negative fixed charge. In an SOI structure, although a back bias voltage is not applied to a back gate, the negative fixed charge can minimize a variation in the threshold voltage Vth due to a silicon channel thickness. Also, since holes may be accumulated in an interface between the back bias dielectric and the semiconductor layer, embodiments may enable retention characteristics of the 1-T DRAM to be improved.

In embodiments, the back bias dielectric having the negative fixed charge may be shared by multiple, e.g., two, neighboring transistors. Also, since the semiconductor devices may include a buried bit line structure, a manufacturing process for forming a semiconductor device may be simplified. Further, a buried dielectric may be provided to improve interfacial characteristics between the back bias dielectric and the semiconductor layer. The buried dielectric may include a thermal oxidation layer.

In embodiments of processes for forming the semiconductor devices, it is possible to independently control a thickness of the gate dielectric and/or a thickness of the back bias dielectric. The silicon channel layer may be formed using a laser enhanced growth method.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor substrate;
   a device isolation layer extending in a first direction on the semiconductor substrate and at least partially defining a bit line;
   a pair of semiconductor structures electrically contacting the bit line and disposed on the bit line, the semiconductor structures extending in a second direction crossing the first direction;
   a back bias dielectric disposed on a first side of each of the semiconductor structures, the back bias dielectric being on the bit line and spaced apart from an upper surface of the semiconductor substrate;
   gate electrodes disposed on a second side of each of the semiconductor structures, the gate electrodes extending in the second direction; and
   a gate dielectric disposed between each of the corresponding ones of the gate electrodes and the semiconductor structures,
   wherein:
   the back bias dielectric is disposed between the first sides of the semiconductor structures facing each other,
   the back bias dielectric includes a negative fixed charge, and
   the negative fixed charge accumulates holes at surfaces of the first sides of the semiconductor structures.

2. The semiconductor device as claimed in claim 1, wherein the back bias dielectric extends in the second direction.

3. The semiconductor device as claimed in claim 1, further comprising:
   source contact plugs electrically connected with the semiconductor structures; and
   a source line electrically connected with the source contact plugs and extending in the second direction.

4. The semiconductor device as claimed in claim 1, further comprising a buried dielectric disposed between the semiconductor structure and the back bias dielectric, and extending to the bit line.

5. The semiconductor device as claimed in claim 1, wherein the back bias dielectric includes at least one of a silicon oxide layer, an aluminum oxide layer, a titanium oxide layer, a tantalum oxide layer, a zirconium oxide layer, a hafnium oxide layer, a hafnium silicon oxide layer, and/or a zirconium silicon oxide layer.

6. The semiconductor device as claimed in claim 1, wherein the negative fixed charge is formed by a halogen group negative ion.

7. The semiconductor device as claimed in claim 1, wherein the back bias dielectric does not electrically contact a bias electrode.

8. The semiconductor device as claimed in claim 1, wherein the gate electrodes extend between an upper dielectric pattern and a lower dielectric pattern.

9. The semiconductor device as claimed in claim 1, wherein the back bias dielectric is wider at an upper portion thereof than at a lower portion thereof.

10. A semiconductor device, comprising:
a back bias dielectric including a negative fixed charge;
a gate electrode overlapping the back bias dielectric;
a semiconductor layer disposed between the gate electrode and the back bias dielectric;
a gate dielectric disposed between the semiconductor layer and the gate electrode; and
a bit line extending along a first direction, wherein the gate electrode is arranged on the bit line and extends in a direction crossing the first direction,
wherein:
the negative fixed charge accumulates holes at a surface of the semiconductor layer facing the back bias dielectric, and
the back bias dielectric does not electrically contact a bias electrode.

11. The semiconductor device as claimed in claim 10, further comprising a dielectric disposed between the semiconductor layer and the back bias dielectric.

12. The semiconductor device as claimed in claim 10, wherein the negative fixed charge is formed by a halogen group negative ion.

13. The semiconductor device as claimed in claim 10, wherein the back bias dielectric is wider at an upper portion thereof than at a lower portion thereof.

14. The semiconductor device as claimed in claim 10, wherein the semiconductor device is a 1-T DRAM.

15. The semiconductor device as claimed in claim 10, wherein the back bias dielectric includes at least one of a silicon oxide layer, an aluminum oxide layer, a titanium oxide layer, a tantalum oxide layer, a zirconium oxide layer, a hafnium oxide layer, a hafnium silicon oxide layer, and/or a zirconium silicon oxide layer.

16. The semiconductor device as claimed in claim 10, wherein the semiconductor layer is arranged on a semiconductor substrate and the semiconductor layer extends along a direction crossing a plane along which the semiconductor substrate extends.

17. The semiconductor as claimed in claim 10, wherein the semiconductor layer includes a pair of semiconductor structures, and the back bias dielectric is arranged between the pair of semiconductor structures.

18. The semiconductor as claimed in claim 10, wherein the gate electrode extends between an upper dielectric pattern and a lower dielectric pattern.

19. The semiconductor device as claimed in claim 17, wherein the back bias dielectric is continuous and includes:
a first portion that is between the pair of semiconductor structures, and
a second portion that is between a second pair of semiconductor structures.

* * * * *